(12) United States Patent
Sasaki

(10) Patent No.: US 6,198,304 B1
(45) Date of Patent: Mar. 6, 2001

(54) PROGRAMMABLE LOGIC DEVICE

(75) Inventor: Paul T. Sasaki, Sunnyvale, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 09/255,237

(22) Filed: Feb. 22, 1999

Related U.S. Application Data

(60) Provisional application No. 60/075,784, filed on Feb. 23, 1998.

(51) Int. Cl.[7] ....................................................... G06F 7/38
(52) U.S. Cl. ............................................... 326/39; 326/41
(58) Field of Search .................................. 326/39, 41, 38

(56) References Cited

U.S. PATENT DOCUMENTS

| | | |
|---|---|---|
| 4,847,612 * | 7/1989 | Kaplinsky ........................ 340/825.8 |
| 5,128,559 | 7/1992 | Steele . |
| 5,504,444 | 4/1996 | Sasaki . |
| 5,808,479 | 9/1998 | Sasaki et al. . |
| 5,809,281 | 9/1998 | Steele et al. . |
| 5,894,565 * | 4/1999 | Furtek et al. ........................ 395/500 |

* cited by examiner

Primary Examiner—Michael Tokar
Assistant Examiner—Anh Tran
(74) Attorney, Agent, or Firm—Townsend & Townsend

(57) ABSTRACT

A logic cell for a programmable logic device that features a random access memory adapted to selectively function as additional logic functions for the logic cell or one of a several different types of random access memory. For example, the random access memory may be configured to provide AND-OR logic functions or as a 32×1 single input port random access memory, two 16×1 single input port random access memories or a 32×1 dual input port memory.

14 Claims, 12 Drawing Sheets

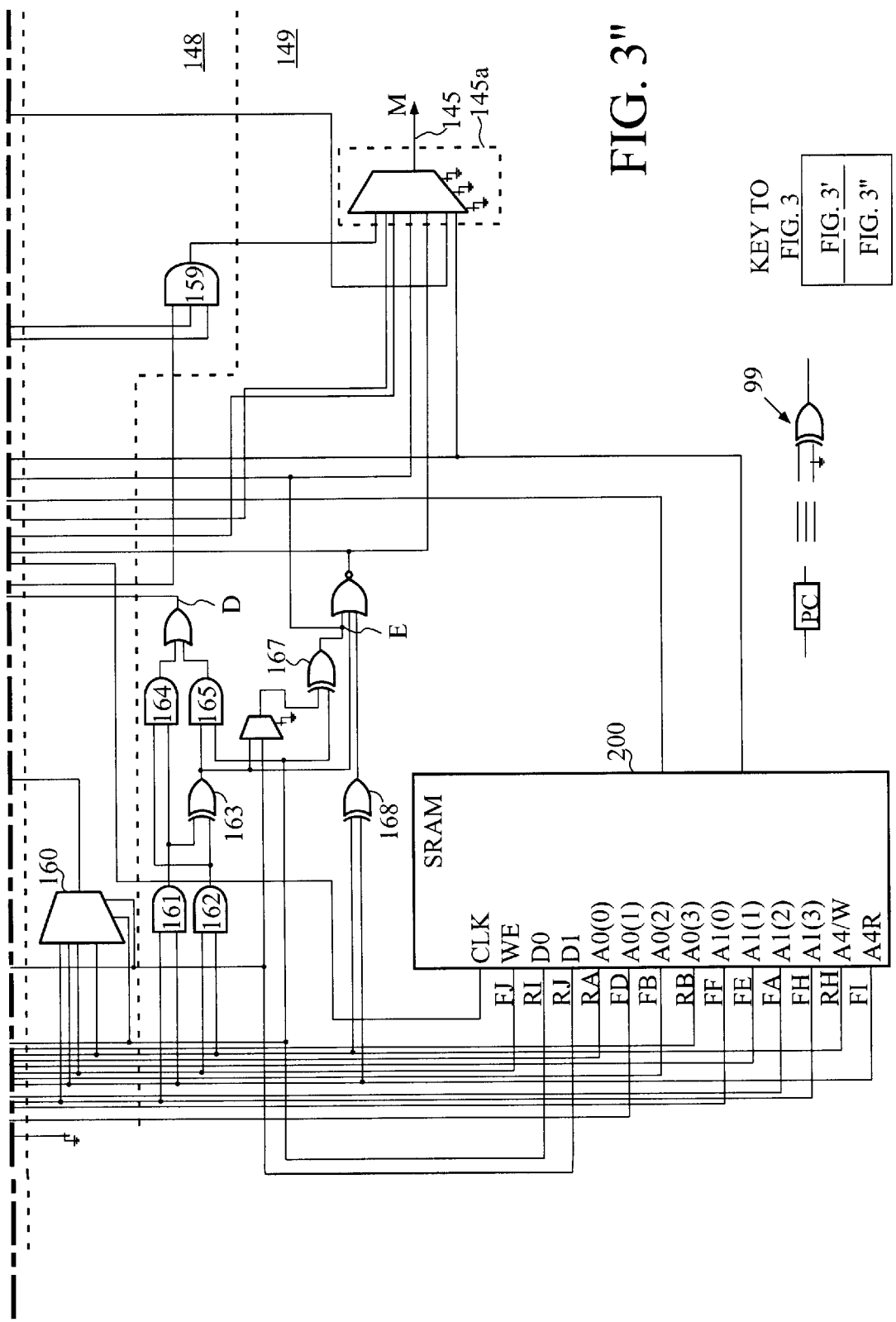

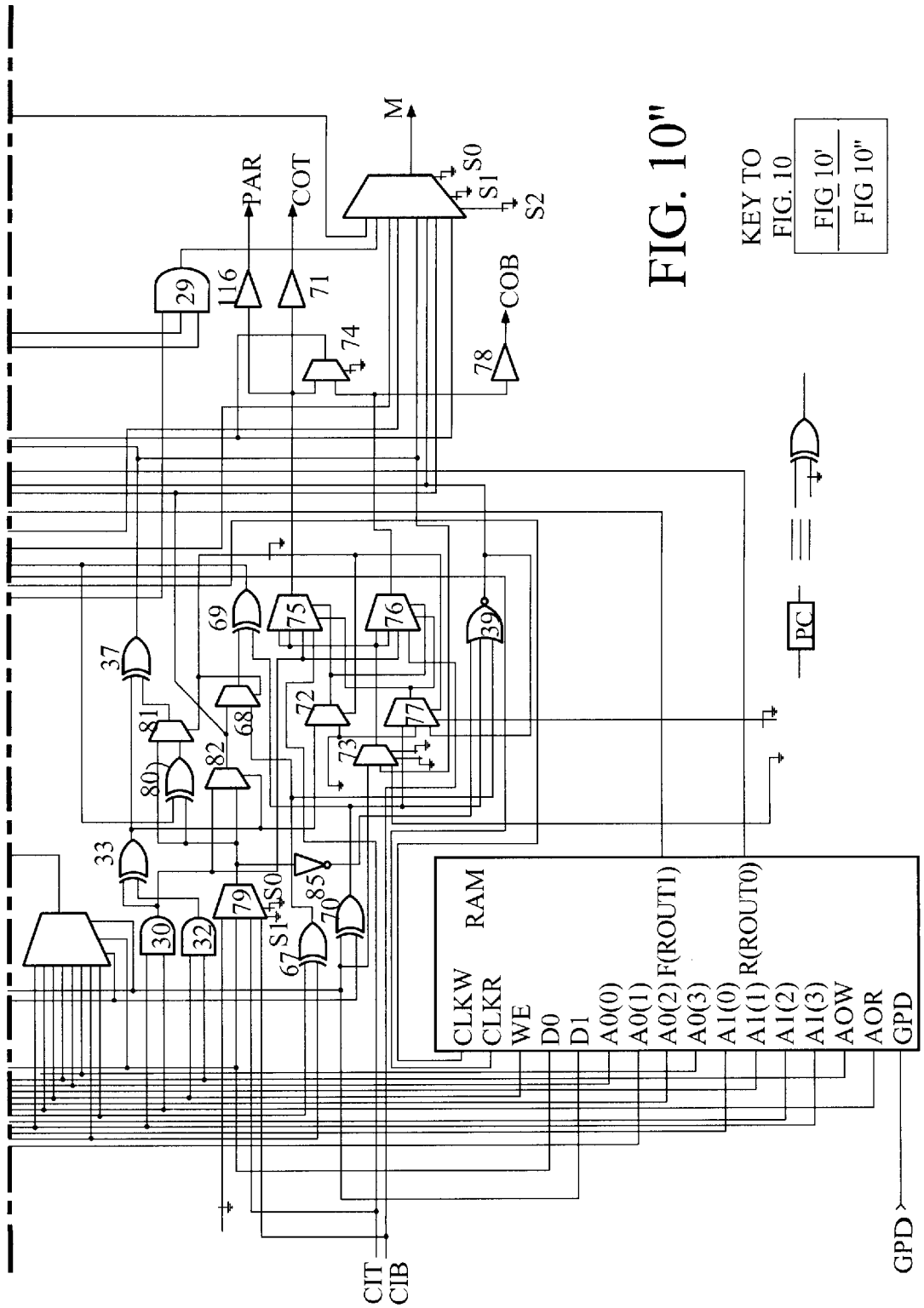

PROGRAMMABLE LOGIC DEVICE

CROSS-REFERENCES TO RELATED APPLICATIONS

This application is a non-provisional application of U.S. provisional patent application No. 60/075,784 filed Feb. 23, 1998 entitled "IMPROVED PROGRAMMABLE LOGIC DEVICE" having Paul T. Sasaki identified as an inventor. The provisional patent application No. 60/075,784 is incorporated by reference in its entirety.

BACKGROUND OF THE INVENTION

This invention relates to programmable logic, and in particular to an active driver circuit particularly suited for a high speed programmable logic device.

A programmable logic device (PLD) is a programmable integrated circuit that allows the user of the circuit, using software control, to customize the logic functions the circuit will perform. A typical PLD consists of an array of identical logic cells that can be individually programmed, and which can be arbitrarily interconnected to each other to provide internal input and output signals, thus permitting the performance of highly complex combinational and sequential logic functions. The program is implemented in the PLD by setting the states of programmable elements such as memory cells.

One type of PLD, known as programmable logic arrays (PLA), is a combinatorial two-level AND/OR integrated circuit, which can be programmed to perform sum-of-products logic. Such devices typically consist of a series of AND gates having input terminals which can be programmably connected to chip input signals, and a series of OR gates which may be programmably connected to receive the output signals from the AND gates.

Another type of PLD is known as programmable array logic (PAL). PALs use a fixed OR array and bidirectional input/output pins. A disadvantage of both PALs and PLAs is the lack of density with which they may be programmed. In other words, although the array is capable of performing many logic functions, utilization of the array is not as complete as desirable. Furthermore the size of the array increases faster than its programming capability.

A response to this problem has led to the development of the field programmable gate arrays (FPGAs) which have "macrocells" or logic cells in programmable logic devices. A macrocell or logic cell is a small grouping of logic capable of performing many different functions, and being selectively interconnectable to other macrocells or logic cells. This allows the logic in the programmable logic device to assume a more granular structure in which pieces of the logic communicate with other pieces, to provide an overall more efficient utilization of the integrated circuit. For purposes of the present specification, "programmable logic device" is defined as a programmable array logic (PALs), programmable logic arrays (PLAs), field programmable gate arrays (FPGAs), and other types of programmable logic devices (PLDs).

Many PLDs may be programmed only once. This may be performed as a final process during fabrication of the device. Another type of PLD may be programmed subsequent to formation. This is typically achieved by connecting the AND and OR arrays, as well as to and from the macrocells, by various fusible connections.

Other types of PLDs may be programmed multiple times, i.e., they may be reprogrammed. To that end, the PLDs typically include erasable programmable read only memory (EPROM) cells, electrically erasable read only memory (EEPROM) cells or the like to retain the programming information, typically referred to as configuration data. Reprogramming is achieved by changing the configuration data contained in the memory cells.

Reprogrammable PLDs also employ random access memory (RAM) cells to store configuration data. Typically static random access memory (SRAM) cells are employed to store the configuration data. Unlike EPROM and EEPROM cells, configuration data stored in SRAM cells is lost when power to the PLD is terminated. However, SRAM cells are easily programmable and require less power to operate than the EPROM and EEPROM cells, making SRAM an attractive element in which to store configuration data for a PLD. To that end, there are many prior art attempts employing SRAM in a PLD.

U.S. Pat. No. 5,128,559 to Steele discloses a PLD having a macrocell that employs RAM, to perform logic functions, and circuitry which allows writing of data to the RAM during use. Each macrocell may be configured at programming time to function as a standard RAM or to perform logic functions.

U.S. Pat. No. 5,809,281 to Steele et al. discloses a PLD having a number of configurable function blocks, each of which is separately configurable to function as either programmable logic or a block of SRAM. Each configurable function block may include a volatile logic array comprised of an array of "AND" gates and an array of "OR" gates with programmable connections. The programmable connections in the volatile logic array comprise SRAM cells. These SRAM cells are capable of functioning in one of two states. In a first state, the SRAM cells provide programmable connections, which direct the logic operations in the volatile logic array. In the second state, the SRAM functions as a block of SRAM using standard read/write modes. As described above, the prior art provides PLDs that have macrocells with one of two discrete functions.

What is needed, however, is a PLD that provides more flexibility in the macrocell by allowing the same to concurrently provide multiple functions.

SUMMARY OF THE INVENTION

Provided is a logic cell for a programmable logic device that features a random access memory (RAM) element adapted to selectively function as additional logic functions for the logic cell or one of a several different types of RAM. For example, the RAM element may be configured to provide AND-OR logic functions or as a 32×1 single-port static random access memory (SRAM), two 16×1 single-port SRAMs or a 32×1 dual-port SRAM. Typically, the inputs of the circuitry to provide AND-OR logic functions in the logic cell may be in common with the input points of the RAM element at the input nodes. To synchronize the operations of both the AND-OR logic function circuit and the RAM element, the logic cell includes a clock selection circuit. The clock selection circuit selects between multiple clock pulses, generated externally to the logic cell, to transmit the same as a clock signal to the various components of the logic cell. To that end, the AND-OR circuit and the RAM element are both connected to receive the same clock signal. This architecture allows the logic cell to concurrently provide AND-OR logic functions and SRAMs and allows concurrently placing an input signal to both the RAM element and the logic circuit to produce a desired signal output. Moreover, because the RAM element may be reconfigured to function as either a single-port SRAM, a dual-port SRAM and circuitry to provide AND-OR logic functions, the present logic cell provides added functional flexibility to a PLD.

DESCRIPTION OF THE SPECIFIC EMBODIMENTS

Figure 1:
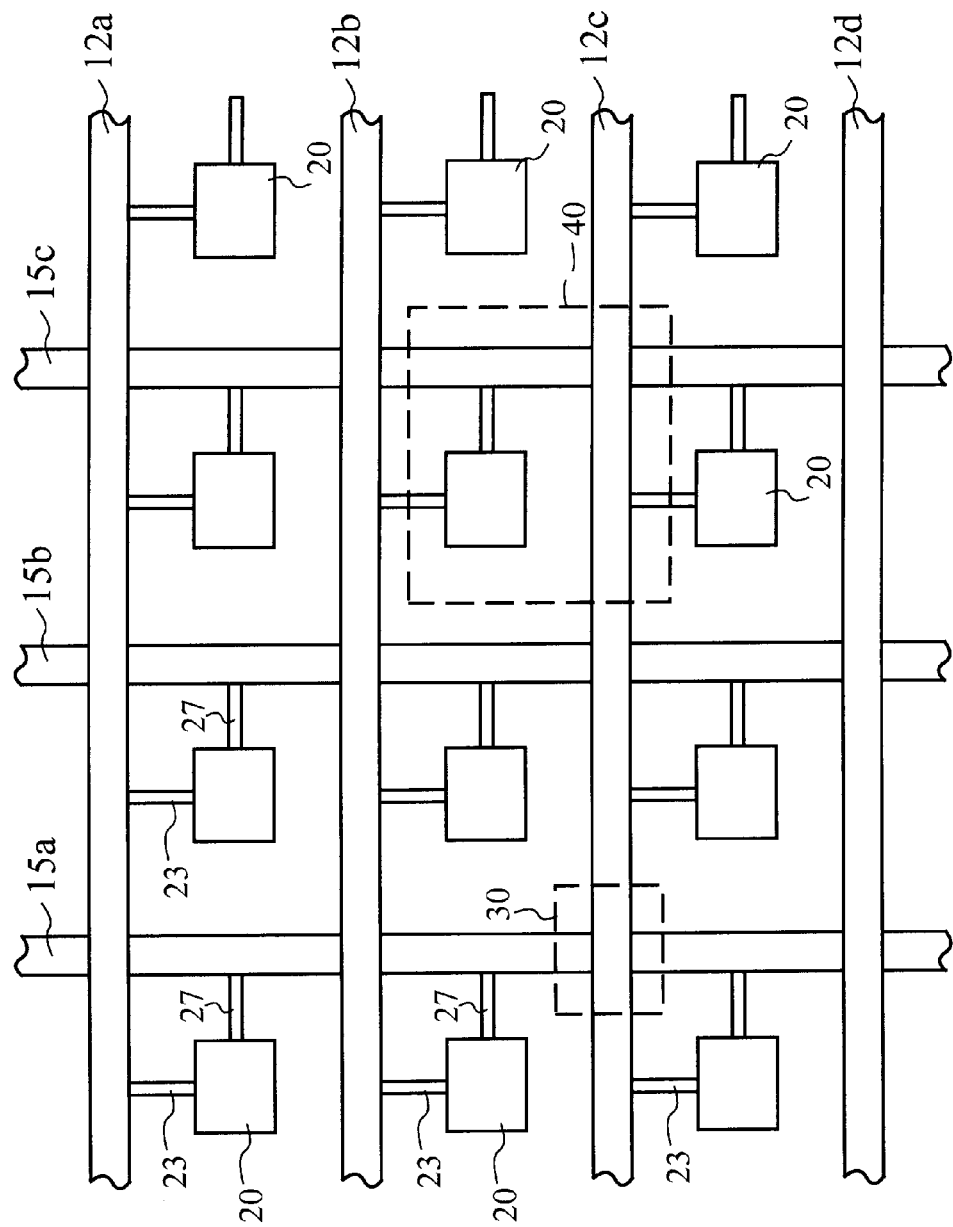
FIG. 1 is a block diagram showing an overall layout of an integrated circuit employing the programmable logic device in accordance with the present invention.

FIG. 1 is a block diagram illustrating the overall layout of a high speed programmable logic device (PLD) that includes a first set of interconnect buses 12a, 12b, 12c and 12d extending transversely to a second set of interconnect buses 15a, 15b, and 15c and a series of logic cells 20 disposed within the matrix of routing channels. In the conventional manner of PLD operation, the routing channels contain buses of conductors for supplying input signals to the logic cells, and receiving output signals therefrom. Often, the output signals from a logic cell are used as the input signals to another logic cell. As is well known, each logic cell can perform any desired logical operation, either combinatorial or sequential, or both, upon the input signals supplied to it. The particular logic function performed by a logic cell depends upon its program state, which is typically "loaded" into the cell using external circuitry. The state is defined using control bits from the external apparatus to set multiplexers, flip-flops, gates, etc.

In the general block diagram of FIG. 1, the logic cells 20 receive input signals from buses 12a, 12b, 12c and 12d, and supply output signals onto the buses 15a, 15b, and 15c. The input signals are transmitted from the bus and supplied to the logic cell by conductors 23, and the resulting output signals are supplied to the output buses 15a, 15b, and 15c using conductors 27. As will be explained, these conductors themselves are programmable in the sense that the input nodes of the logic cells may either be connected to, or disconnected from, selected lines in the input data buses 12a, 12b, 12c and 12d. Of course, as mentioned, the input data bus itself may carry as signals output information from other logic cells.

Connections between the input and output data buses may be made in location 30, where these buses cross each other. Although the buses are depicted as crossing each other in the drawing of FIG. 1, in actual practice they are formed using different levels of metal or other conductive material on an integrated circuit, and are electrically isolated from each other unless an electrical connection between them has been "programmed." The manner in which the conductors may be coupled to each other in the crossing regions 30 is described further below.

An advantage of the structure is modularity. As shown within dashed line 40, essentially all of the integrated circuit area is consumed using regular modules 40, which include the interconnect buses 12a, 12b, 12c and 12d and 15a, 15b, and 15c, the logic cell 20, and the buses 23 and 27 to provide signals to, and receive signals from, the logic cell. This modular structure facilitates an efficient layout of the integrated circuit.

Thus, as shown, each output of a logic cell extends for the entire vertical span of the chip layout. The output buses extend along only one side of the logic cell, and stop at the chip edges. The input buses, however, "wrap-around" at the periphery of the integrated circuit. For example, buses 12a and 12b will be connected together at the East End or the West End of the circuit. In this manner, the input buses extend in a serpentine fashion across the surface of the entire circuit. Thus, bus 12a will be connected to bus 12b at either the eastern edge or the western edge of the chip, then bus 12b coupled to bus 12c at the opposite edge, etc.

The input and output buses are preferably unidirectional. For example, in an emitter-coupled logic (ECL) implementation, or in a complementary MOS (CMOS) implementation, the buses will be unidirectional over the shortest segments, but can be made bidirectional in different segments of a common bus by isolating the segments from each other as will be described. Depending upon the length of the buses, the input/output signal strength, and other factors, it may be desirable to employ "repeaters" within the buses. These repeaters consist of small amplifiers to isolate the capacitance in the circuit, and thereby decrease signal propagation delays, enhancing overall system speed and are described in U.S. Pat. No. 5,808,479 to Sasaki et al. and U.S. Pat. No. 5,504,440 to Sasaki both of which is assigned to assignee of the present invention and is incorporated herein by reference.

Figure 2:
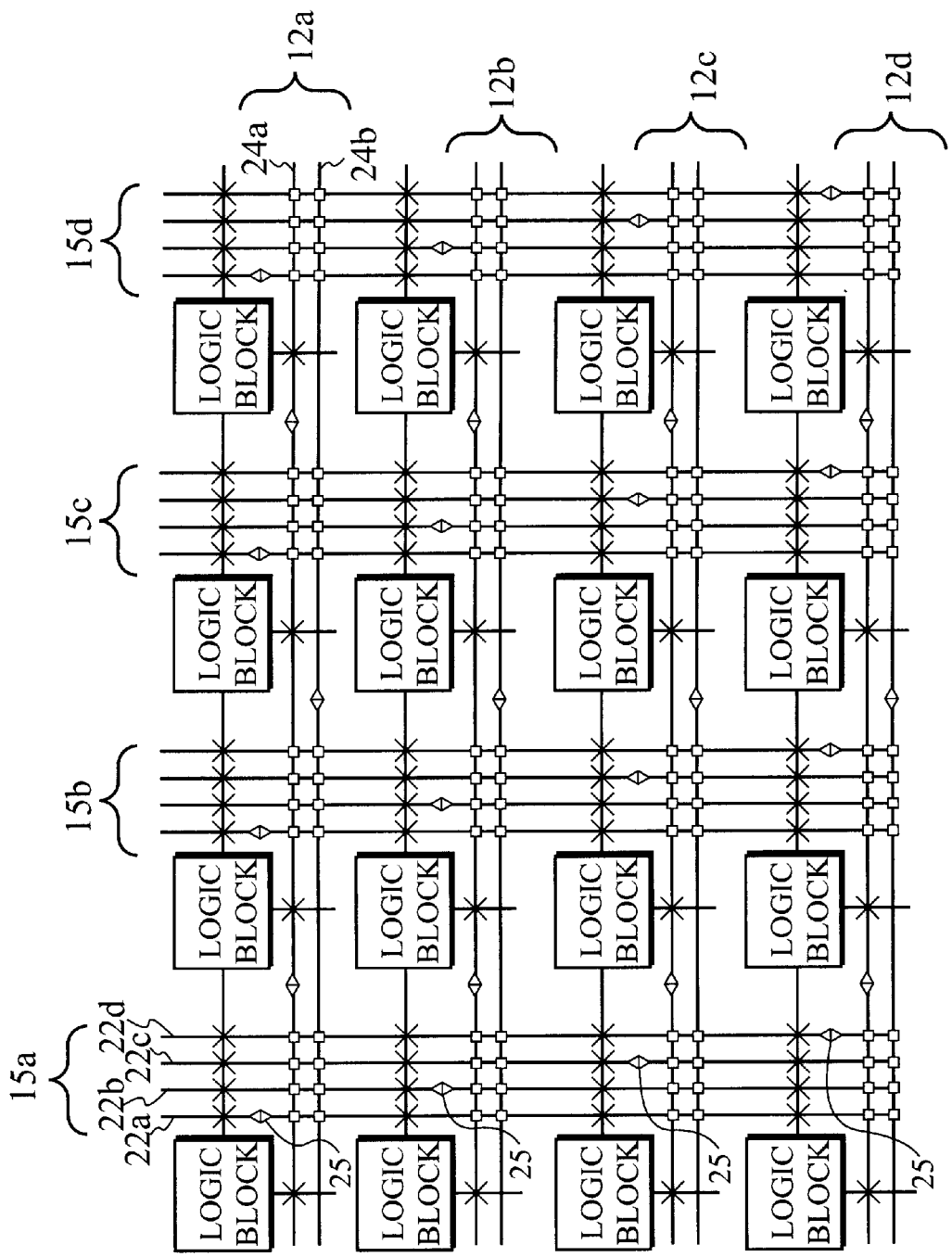
FIG. 2 is a detailed block diagram showing the placement of active repeaters along the interconnect buses shown above in FIG. 1.

Referring to FIG. 2, the placement of active repeaters on the interconnect buses 12a, 12b, 12c and 12d and 15a, 15b, 15c, and 15d are shown. Specifically, interconnect buses 15a, 15b, 15c, and 15d are shown as including a plurality of lines 22a, 22b, 22c and 22d, each of which represents nine wires. Interconnect buses 12a, 12b, 12c and 12d also shown as including a plurality of lines 24a and 24b, each of which represents fifteen wires. The symbol "X" in FIG. 2 represents an unidirectional logic connection (LC) between intersecting lines, and the rectangle represents a bidirectional LC. As seen therein the repeaters 25 are staggered across the lines 24a and 24b of interconnect buses 12a, 12b, 12c and 12d and 22a, 22b, 22c and 22d of interconnect buses 15a, 15b, 15c, and 15d. Specifically, the repeaters 25 are disposed so that as one of the interconnect buses 12a, 12b, 12c and 12d and 15a, 15b, 15c, and 15d extend the length of the PLD, along a first direction, consecutive repeaters 25 connected to the buses 12a, 12b, 12c and 12d or 15a, 15b, 15c, and 15d are disposed on differing lines, with repeaters on adjacent lines being offset along the first direction. Preferably the repeaters are disposed so the lines adjacent to a region of a line extending between two repeaters connected thereto each has a repeater connected to it, with repeaters on adjacent lines being offset along the first direction. By staggering the repeaters 25 the routing regions of the PLD is irregular. That allows the output of logic cells to access a much greater area of the PLD. For example, with the repeaters being staggered, a single logic cell may have access to thirty-four additional logic cells.

Figure 3:
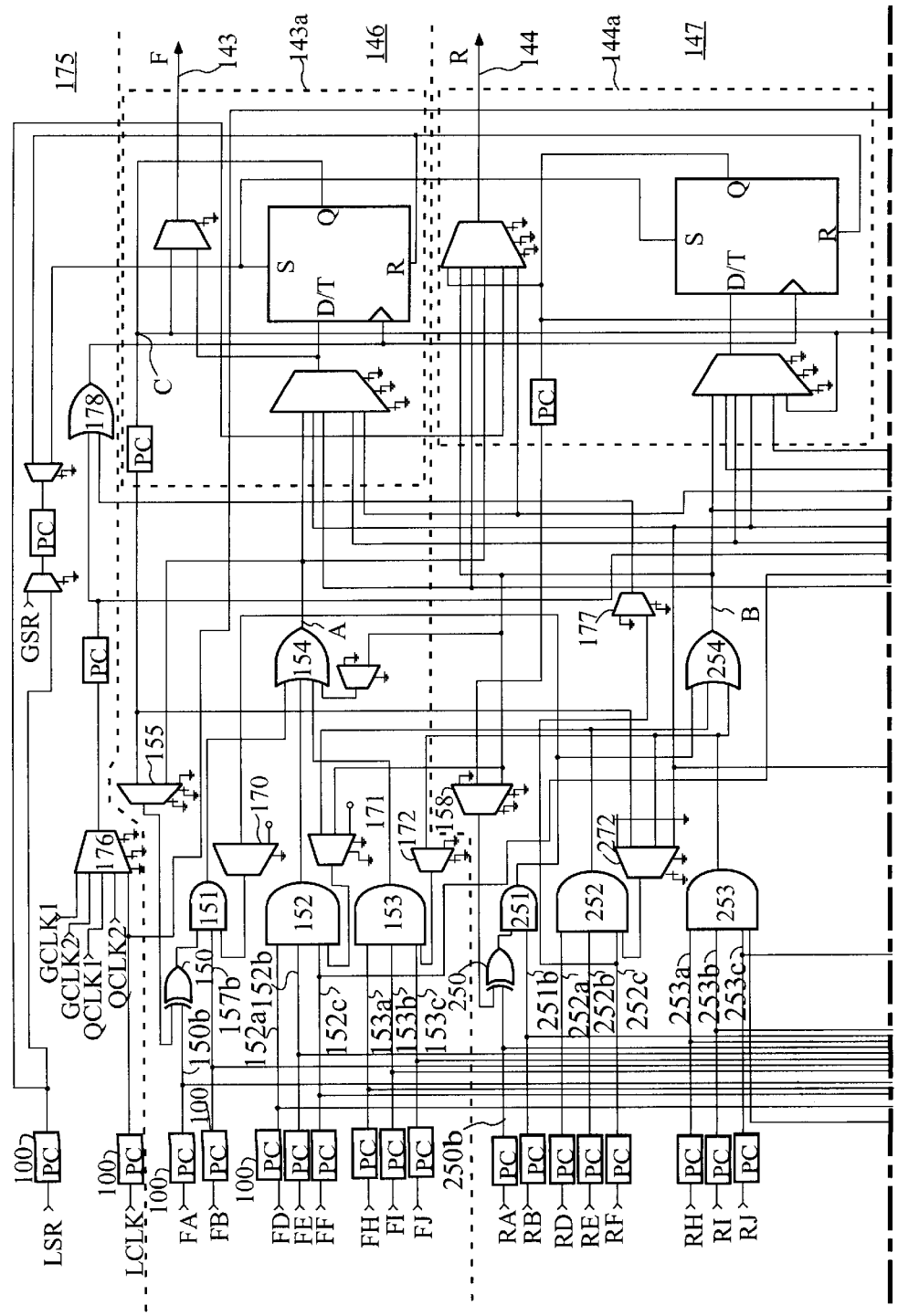
FIG. 3 is a schematic drawing of the circuitry of one logic cell shown above in FIGS. 1 and 2 employing a random access memory element in accord with the present invention.

FIG. 3 shows a preferred embodiment of the logic cell 20 that is coupled to potentially, depending on the programming, receive up to eighteen input signals at the signal inputs 100. As described in conjunction with FIG. 1, the logic cell shown in FIG. 3 is used to perform the logical operations on the input signals from the input buses, and place the resulting output signals on the output buses for use by other cells, or to be supplied by the integrated circuit to other electronic apparatus. For the purpose of explanation, the logic cell can be considered as being divided into five sections as shown by the dashed lines extending across FIG. 3. The uppermost section 175 provides clock and set/reset signals to the logic cell. Sections 146 and 147 each provides high level functions, as described below. Section 148 provides a multiplexing function, and the bottom section 149 provides arithmetic and comparing function. The bottom section adder can provide a carry to the top section, or permit the comparison of three bits to detect whether all are the same.

In section 175, the clock and set/reset signals are input to the logic cell. Multiplexer 176 selects among five possible clock inputs to the registers in the logic cell, which is transmitted to the remaining sections of the logic cell as a clock pulse. This permits the logic cell to have a clock rate that differs from the clock rate of the overall PLD or other logic cells of the PLD.

Logic gates 150, 151, 152, 153, and 156 of section 146 define an AND-OR logic circuit having inputs 150b, 151b, 152a, 152b, 152c, 153a, 153b, and 153c and an output at node A. The signal at node A is placed at the output 143 of the logic cell by output circuitry 143a. Feedback from some of the gates in section 147 is permitted by the multiplexers 170, 171, 172. This enables supplying of some of the input signals directed to the section 147 to section 146, as well. Multiplexer 155 provides a feedback multiplexer, enabling, in combination with gate 156, a latch function to be provided. The feedback path from flip-flop 157 provides a load function for a counter or a shifter. The flip-flop itself provides a path for controlling data flow from the logic cell to external circuitry. When the flip-flop is configured as a D-type flip-flop, it provides for shifting. When configured as a T-type flip-flop, it provides counting capability. Section 147 of the logic cell duplicates the functionality of section 146.

To that end, logic gates 250, 251, 252, 253, and 256 of section 147 define an AND-OR logic circuit having inputs 250b, 251b, 252a, 252b, 252c, 253a, 253b and 253c and an output at node B. The signal at node B is placed at the output 144 of the logic cell by output circuitry 144a. Section 147 is linked to the remaining sections of the logic cell at several locations. For example, multiplexer 177 allows the gating of a selected clock in section 175 through OR gate 178. Also, the AND gate output in section 147 can be coupled through multiplexer 179 as an input to the OR gate 154 in section 146, creating an overall AND-OR logic cell with a larger fan-in than one of the two section 146 or 147 by itself. By programmably coupling section 146 and 147 of the logic cell together, the overall logic cell can also provide a two-bit counter. This counter can be chained together with other counters provided by other logic blocks to make long counters. The connection at node C allows the upper unit to shift data to the lower unit.

Section 148 of the logic cell, consisting primarily of multiplexer 160, can be programmed to provide a straight multiplexing function on a subset of the input signals. This function may be achieved without introducing a delay when passing signals through the combination logic.

In section 149 of the logic cell, gates 161, 162, 163, 164, 165, 166, and 167 enable provision of a full adder with a carry bit at node D. The sum appears at node E. Gates 161 and 162 allow multiplexing, while gates 163, 168, and 167 allow comparison of three-bit quantities. The output from the aforementioned gates is placed on the output 145 of the logic cell via output circuit 145a. Also included in this section is a random access memory element 200, which is discussed in more detail below.

Throughout the logic cell shown in FIG. 3, the elements labeled PC provide polarity control on the signal, using, for example, an exclusive OR gate 99. The rectangular symbol with "PC" inside it designates this polarity control connection, and is used to simplify the drawing, integrated circuit. By virtue of the programmable interconnections, unused circuits consume no power, yet polarity control is provided on all signal inputs 100. Also, as shown, each multiplexer in the logic cell is connected to be controlled by one or two control bits. These can be either logical 1 or logical 0, thereby providing a one or two bit control signal to the multiplexer to enable selection of one of two, or one of four input lines to the multiplexer. The selected line is coupled to the output terminal of the multiplexer. The architecture of the logic cell shown in FIG. 3 facilitates construction of a set of logic functions. In contrast to the approach followed by other PLD architectures. This architecture is optimized to provide various functions, rather than provide overall complete flexibility and functionality. By providing a relatively large logic cell, fewer connections are required and faster overall operating speed is provided. In other architectures, the provision of numerous small logic cells results in many interconnections among blocks, slowing overall system speed.

An additional advantage with the present logic cell is that the functional flexibility of the same is increased by the presence of the random access memory (RAM) element 200. Specifically, in the RAM element 200 allows the logic cell to simultaneously provide both logic functions and function as a standard SRAM. This allows augmentation of the overall efficiency of the logic cell. To that end, the RAM element 200 has a plurality of input points 202 that include a plurality of address inputs $A_0,(0)$, $A_0(1)$, $A_0(2)$, $A_0(3)$, $A_1,(0)$, $A_1(1)$, $A_1(2)$, $A_1(3)$, $A_{4/4W}$ and A4R, write enable WE and a plurality of data inputs $D_0$ and $D_1$. The plurality of data inputs $D_0$ and $D_1$ are connected to a first subset of the plurality of signal inputs, and the plurality of address inputs $A_0,(0)$, $A_0(1)$, $A_0(2)$, $A_0(3)$, $A_1,(0)$, $A_1(1)$, $A_1(2)$, $A_1(3)$, A4/W and A4R are connected to a second subset of the plurality of signal inputs 100. In this manner, the input points 202 of the RAM element 200 are connected in common with input nodes of the logic circuits 253a, 253b and 253c, for example.

To synchronize the operations of the RAM element 200 with the remaining components of the logic cell, a clock input CLK is connected to receive the clock pulse selected by multiplexer 176 in section 175. The RAM element 200 also includes two output points OUT 1 and OUT2. OUT 1 is connected output circuitry 143a and 144a to be selectively placed at with outputs 143 or 144, respectively, of the logic cell. OUT 2 is connected output circuitry 144a and 145a to be selectively placed at with outputs 144 or 145, respectively, of the logic cell.

Figure 4:
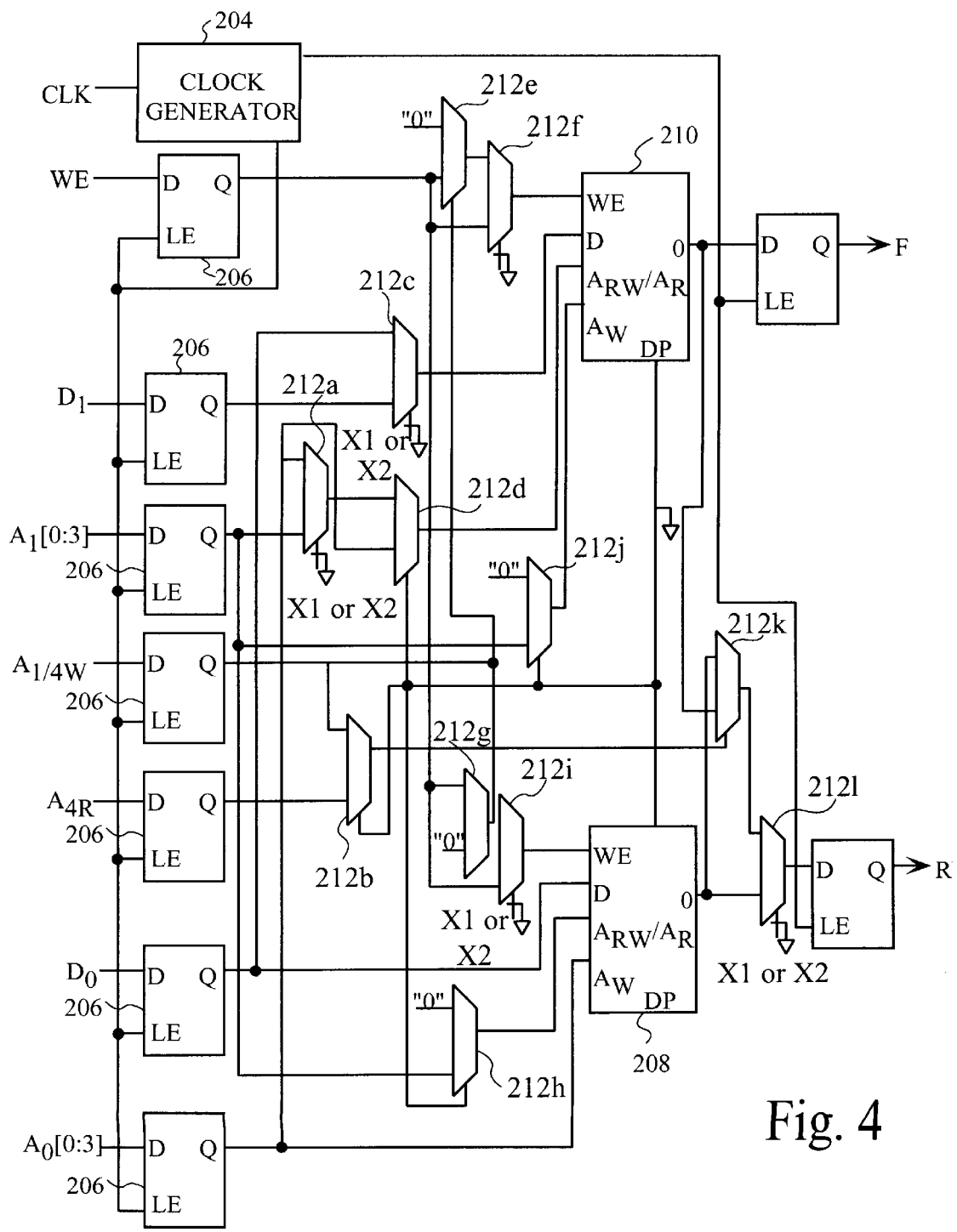
FIG. 4 is a detailed block diagram of the random access memory element shown above in FIG. 3.

The RAM element 200 includes three sections, as shown in FIG. 4. The first section includes the clock generator 204 and a plurality of the latches, shown as D-type flip-flops 206. The clock generator 204 and the D-type flip-flops 206 make the RAM element 200 "self-timed" enabling both read and write operations to be fully synchronous. Only setup and hold times for all inputs with respect to the clock need to be considered, i.e., the write enable WE, data inputs $D_0$ and $D_1$ and address inputs $A_0,(0), A_0(1), A_0(2), A_0(3), A_1(0), A_1(1), A_1(2), A_1(3), A_{4/W}$ and $A_{4R}$. Standard timing parameters such as 'WE signal pulse width,' 'write cycle,' or 'read cycle' are not required allows that RAM element 200 to be treated just like a flip-flop having additional inputs. This is shown in below in FIG. 5.

Figure 5:
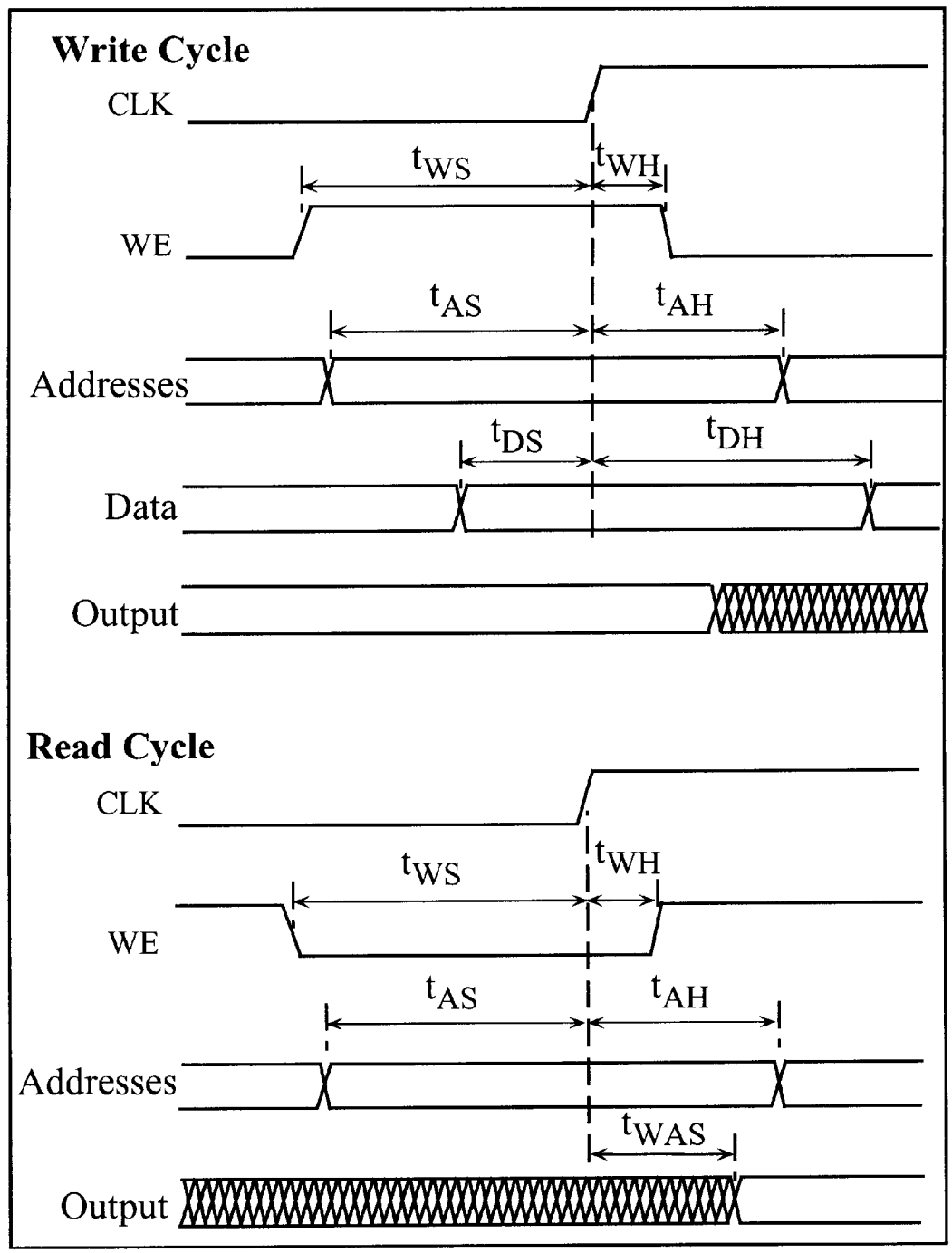
FIG. 5 is a timing diagram describing the read and write cycles of the random access memory element shown above in FIG. 4.

Referring to both FIGS. 4 and 5, upon receiving a signal transitioning between a logical "0" to a logical "1" on the clock input, the clock generator 204 creates a set of internal signals for the RAM element 200. During a write cycle, the clock generator 204 creates a pulse to latch the write enable, data, and addresses. A read cycle is similar except that a pulse is generated to latch the data at the address you are reading in the output latches. Both read and write operations may be completed upon a single transition of the clock signal between a logical "0" and a logical "1", which is true for both single-port and dual-port modes.

The second section of the RAM element 200 is composed of two random access memories, which are preferably static random access memories (SRAMs) 208 and 210. Each of the SRAMs 208 and 210 is a dual-port SRAM having sixteen rows and one column of memory storage elements (16×1) that may addressed by address ports $A_2(0), A_2(1), A_2(2), A_2(3) A_2(4), A_3(0), A_3(1), A_3(2), A_3(3), A_3(4)$ a single data input port D, a write enable port WE and an output port O. The third section of the RAM element 200 includes a plurality of multiplexers, shown generally as 212a–l.

The SRAMs 208 and 210 may be programmed to function as two 16×1 single-port SRAMs. To that end, the two SRAMs 208 and 210 are connected to the input points 202 via the plurality of D-type flip-flops 210 and the plurality of multiplexers 212a–l.

Moreover, the RAM element 200 is configured to provide the function of either additional logic functions for the logic cell or one of a several different types of SRAM by programming the multiplexers 212a–l to route input and output signals accordingly, discussed more fully below. In this fashion, the SRAM may be configured to provide AND-OR logic functions using a look-up table as is well known in the PLD are, or to function as a 32×1 single-port SRAM, two 16×1 bit single-port SRAMs or a 32×1 dual-port memory. When functioning as a standard SRAM, the RAM element may be employed to define the logic functions of the remaining components of the logic cell. Moreover, when functioning as a two 16×1 single-port SRAMs, one of the SRAMs, for example SRAM 208, may define the logic functions of the remaining components of the logic cell. The remaining SRAM 210 functions as a standard SRAM, i.e., allows reading and writing from the various addresses in the memory cell array associated therewith. In this fashion, the RAM element 200 may simultaneously provide two different functions to the logic cell. Alternatively, one of the SRAMs, for example 208, may function as additional logic functions of the logic cell, while the remaining SRAM 210 functions either as SRAM or defines the logic functions of the remaining components of the logic cell.

When functioning as a 32×1 single-port RAM, address information is present at address ports $A_0,(0), A_0(1), A_0(2), A_0(3)$. However, the addresses of the storage elements in each of the SRAMs 208 and 210 are identical. To distinguish between SRAMs 208 and 210 a selection address is present on input $A_{4/4W}$ to determine which SRAM 208 or 210 is to be accessed. If a write enable signal is present at the WE input point, then data at data input Do is written to the selected array 208 or 210.

During a write cycle when the signal at the WE input is at a logic "1", the signal at the $A_4$ input controls the select line of the two multiplexers 212e and 212g that feed the WE pin of SRAM 210 and 208, respectively. If SRAM 210 is selected, the signal at the $A_4$ is a logical "1" and the multiplexer 212e sends the WE signal to SRAM 210. The WE signal of SRAM 208 goes to a logical "0", because of the fixed logical "0" on the input to the multiplexer 212g. When the signal on the $A_4$ input is at a logical "0", the signal on SRAM 208's WE input goes to a logical "1", because the other input of the two multiplexers 212g and 212i is selected. The signal at the $A_4$ input also controls the select line of the output multiplexers 212k and 212l whose inputs are the outputs of SRAM 210 and 208. Again, a logical "1" on A4 selects SRAM 210 and a logical "0" will select SRAM 208. The selected data is then sent to the output latch.

In this manner, the configured SRAM element 200 has five inputs for addresses $A_0,(0), A_0(1), A_0(2), A_0(3)$ and $A_4$, a data input (D), a enable (WE), and a clock input. As stated above, the seven inputs are synchronous to the clock generator 204. The only timing requirement is that all setup and hold times are adhered to, which is similar to the timing requirement to that of an edge-triggered flip-flop. When the signal at the WE input of the RAM element 200 is a logical "1", the RAM element 200 is in the write mode. Data presented on the $D_0$ input is written to the location specified by the aforementioned addresses. During a write cycle, the output of the RAM element 200 is in an unknown state, which is similar to most discrete RAMs.

When the signal at the WE input is at a logical "0", the RAM element 200 is in the read mode. The data stored in the location specified by addresses $A_0,(0), A_0(1), A_0(2), A_0(3)$ and $A_4$ appears on the output after the rising edge of the clock pulse. Again, this is a single-clock operation. The inputs WE and $A_0,(0), A_0(1), A_0(2), A_0(3)$ and $A_4$ are setup before the rising edge of the clock pulse, and the data stored in the RAM element 200 appears after the rising edge of the clock. Using the RAM can be accomplished by calling out the appropriate library components as discussed in Dyna-Chip Library Guide, available from DynaChip Corporation located at 1255 Oakmead Parkway, Sunnyvale, Calif.

When functioning as a dual 16×1 single-port RAM, SRAMs 204 and 206, of the RAM element 200, operate independently. In this manner, twelve inputs are provided. SRAM 208 has four bits of address $A_0(0), A_0(1), A_0(2)$ and $A_0(3)$ and a data input $D_0$, while SRAM 210 has a separate four bits of address $A_{10}(0), A_1(1), A_11(2)$ and $A_1(3)$ and a data input $D_1$. B SRAMs 208 and 210 share a common write enable signal (WE) and clock pulse. As previously described, the eleven inputs are synchronous to the clock pulse. In this configuration, the functionality of the SRAMs 208 and 210 are similar to the functionality as described above with respect to the 32×1 single-port RAM. Upon a logical "1" being present at the WE input, both SRAMs 208 and 210 are in the write mode. Data presented on the $D_0$ input is written to the location specified by addresses $A_0(0)$, $A_0(1)$, $A_0(2)$ and $A_0(3)$, while data presented on the $D_1$ input is written to the location specified by addresses $A_1(0)$, $A_1(1)$, $A_1(2)$ and $A_1(3)$.

When the signal at the WE input is at a logical "0", the SRAMs 208 and 210 are in the read mode. After the rising edge of the clock pulse, the data stored in the location specified by $A_0(0)$, $A_0(1)$, $A_0(2)$ and $A_0(3)$ appears on the output of SRAM 208, and the data stored in the location specified by $A_1(0)$, $A_1(1)$, $A_1(2)$ and $A_1(3)$ appear on the output of SRAM 210. Again, this is a single-clock operation, and the RAM element 200 can be used by calling out the appropriate library components, as discussed above.

Were the RAM element 200 to function as a 32×1 dual-port RAM, A1(0), SRAMs 208 and 210 are used in their dual-port mode and their selection is controlled by the signal at the $A_{R4}$ and $A_{4W}$ address inputs. Specifically, the signal at the $A_{4W}$ address input controls the multiplexer that allows the signal at the WE input to write to either SRAM 208 or RAM 210. The signal at the $A_{R4}$ input controls the output multiplexer 212l that determines if the contents of SRAM 208 or SRAM 210 will be latched at the output. In this manner the RAM element 200 is provided with five bits of read address $A_{R0}$, $A_{R1}$, $A_{R2}$, $A_{R3}$ and $A_{R4}$, five bits of write address $A_0$, $A_1$, $A_2$, $A_3$ and $A_4$, a data input D, a write enable WE, and a clock input CLK. The aforementioned inputs are synchronous to the clock pulse providing the benefits discussed above.

The operation of the dual-port configuration is slightly different than that of the aforementioned single-port configurations of the RAM element 200. Upon the signal at the WE input being a logical "1", the RAM element 200 is in the write mode. Data presented on the D input is written to the location specified by addresses $A_0$, $A_1$, $A_2$, $A_3$ and $A_4$. The dual-port RAM and the single-port RAM differ in the read cycle, as well. The dual-port RAM is almost always in read mode. The state of the signal at the WE input is unimportant; therefore the signal at the WE input may be either a logical "0" or a logical "1". The data stored in the location specified by $A_{R0}$, $A_{R1}$, $A_{R2}$, $A_{R3}$ and $A_{R4}$ appears on the output after the rising edge of the clock, i.e., a single-clock operation.

The one instance in which the dual-port RAM is not in the read mode occurs when the read and write addresses are equal and the signal at the WE input is at a logical "1". This results in the write function being enabled and the output being at an unknown state. However, no conflict between the read and write modes will exist were the signal at the WE input at a logical "0", because whenever the signal at the WE input is at a logical "0", the dual-port RAM is in read mode. The dual-port RAM may be used by calling out the appropriate library components discussed above with respect to the single-port RAM configurations.

Figure 6:
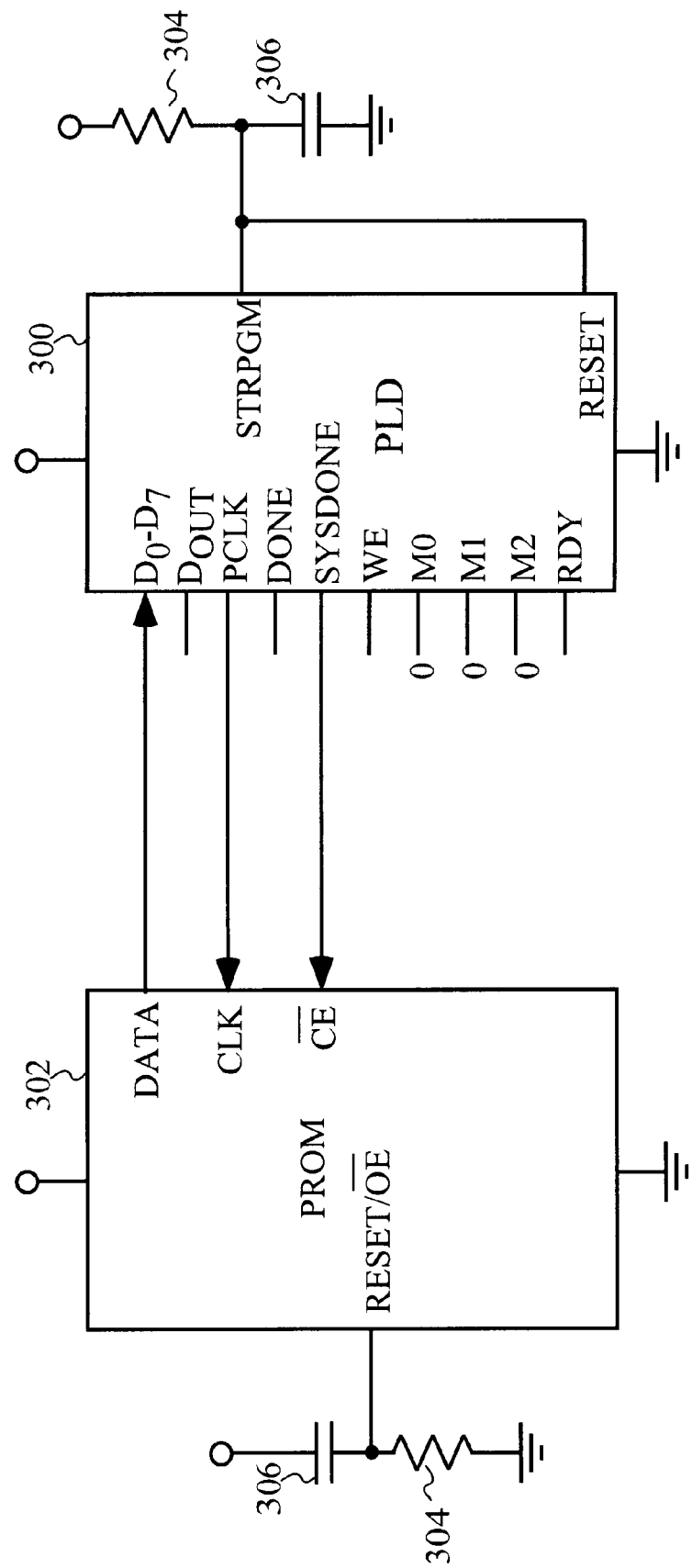
FIG. 6 is a block diagram showing a serial memory mode of programming configuration information into a PLD employing the features shown above in FIGS. 1–4.

Referring to FIGS. 1 and 6, as discussed above, the logic cell is one of many employed in a PLD 300 that may be programmed using software to generate a bit-stream file (not shown) which can be loaded into the PLD 300. Contained within the bit-stream file are a series of "1's" and "0's". These "1's" and "0's" are employed configure the PLD 300 to function as desired. The bit-stream file can be loaded into the PLD 300 using a variety of techniques, some of which may require additional circuitry. The circuitry required depends upon the configuration programming arrangement employed to load the PLD 300 with configuration data. For example, an Intel™ HEX file may be created to program a serial nonvolatile memory device such as an EPROM/EEPROM, shown generally as PROM 302 Upon power-up, data from the EPROM/EEPROM is loaded into the PLD 300. It should be noted that more than one serial PROM maybe necessary depending upon the size of the desired bit-stream. Were the size of the bit-stream larger than the largest available serial PROM 302, multiple serial PROMs can be chained together to create the effect of a larger PROM. As shown, the only external circuitry required are the resistors 304 and capacitors 306, connected to both the STRPGM and RESET pins, as well as the serial PROM 302. Therefore, only connections between the PROM 302, resistor 304, capacitor 306 and the PLD 300 is necessary to configure the PLD 300 upon power-up.

Figure 7:
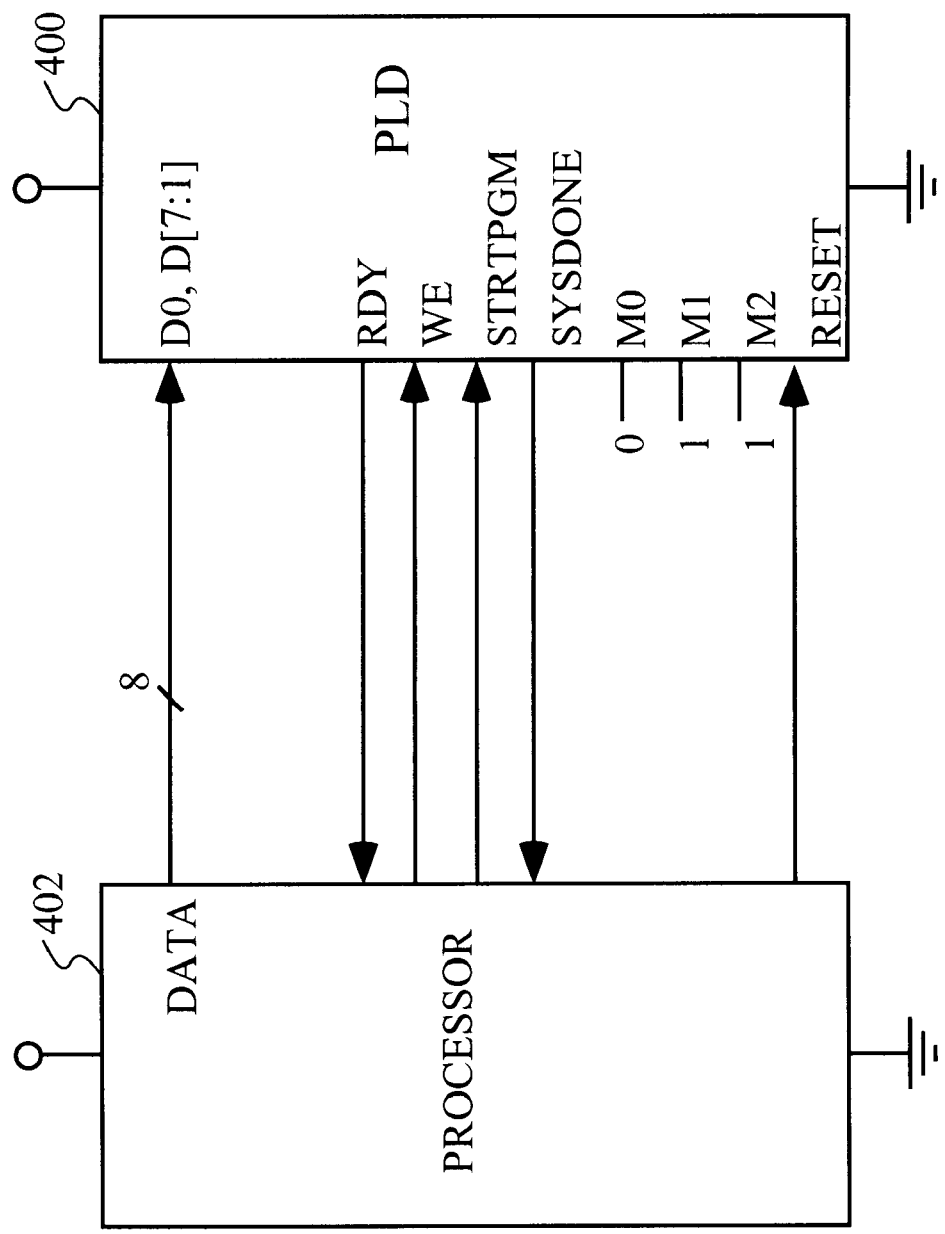
FIG. 7 is a block diagram showing a processor mode of programming configuration information into a PLD employing the features shown above in FIGS. 1–4.

Alternatively, as shown in FIG. 7, the bit-stream file may be loaded via a specially designed fixture, e.g., via processor interface 402 that is in data communication with the PLD 400. In this case, the processor 402 may share control along with the PLD 400, referred to as a single PLD processor programming arrangement.

Figure 8:
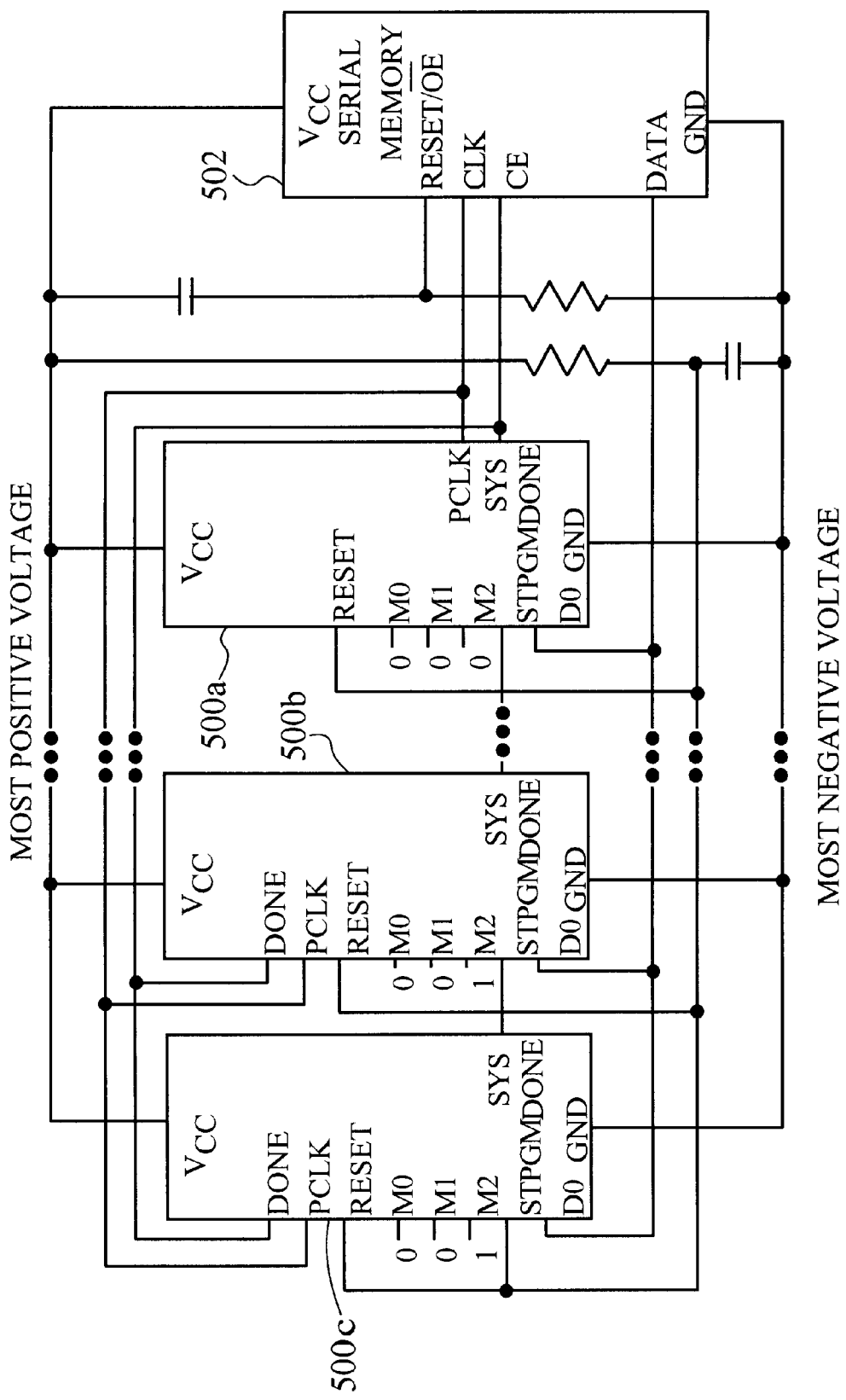
FIG. 8 is block diagram showing multiple PLD configuration programming employing a serial memory mode.
Figure 9:
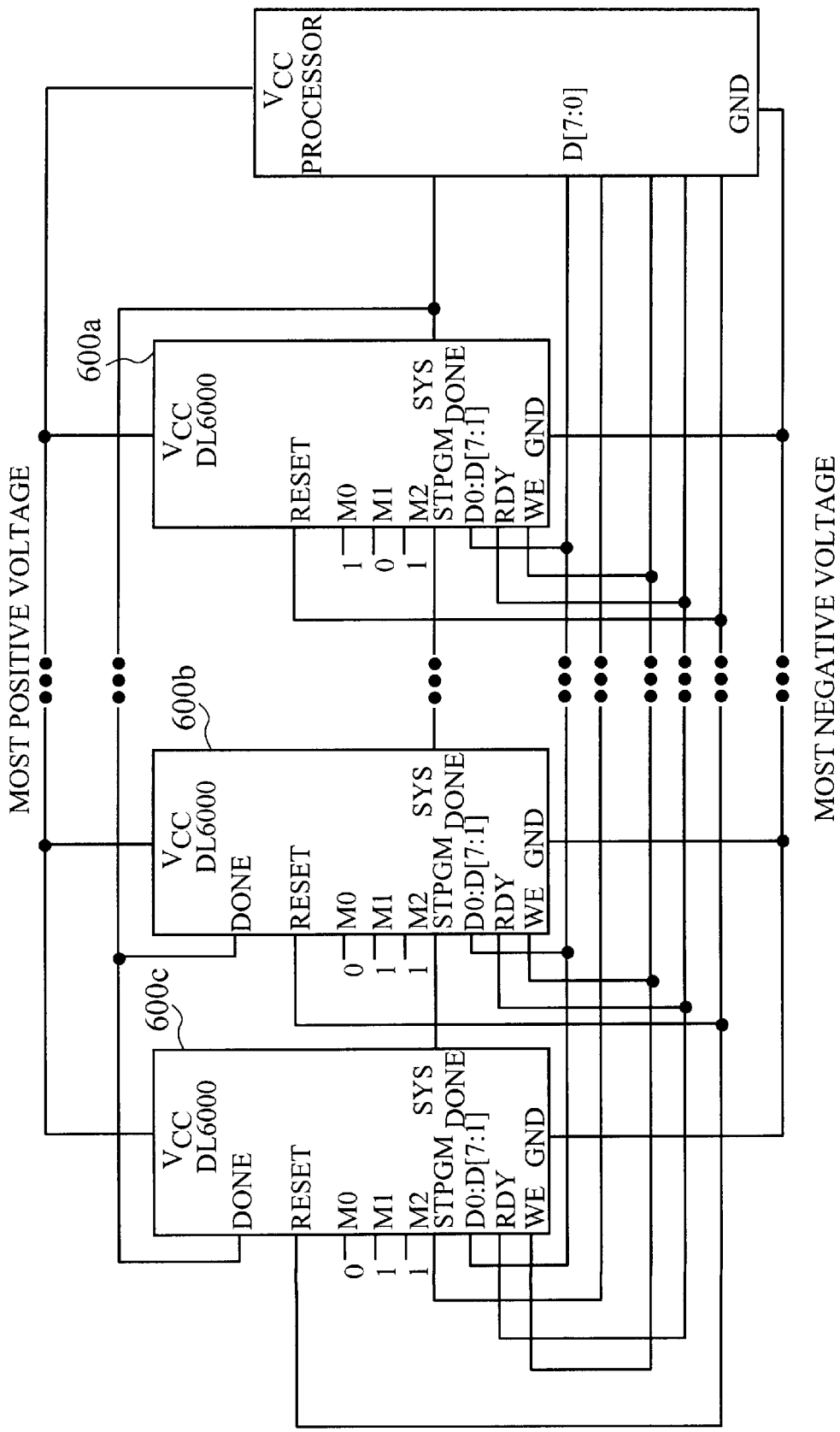
FIG. 9 is block diagram showing multiple PLD configuration programming employing a processor mode.

To reduce the time necessary to program multiple PLDs with configuration data, multiple PLDs may be programmed at any given time by cascading together the PLDs mounted to a PC board. As shown in FIG. 8 multiple PLDs 500a, 500b and 500c are programmed using a serial memory source 502 in the multiple PLD serial programming arrangement. FIG. 9, on the other hand, shows multiple PLDs 600a, 600b and 600c programmed using a processor 602, in the multiple PLD processor programming arrangement. When multiple PLDs are interconnected for programming, as in shown in both FIGS. 8 and 9, the mode pins $M_0$, $M_1$ and $M_2$ are the same for all PLDs, except the last PLD configured. The last PLD controls the configuration program in that mode pins $M_0$, $M_1$ and $M_2$ associated therewith are set accordingly. The pin connections for the various programming arrangements are discussed more fully below.

To minimize the space and cost needed to configure the PLDs 300, 400, 500a–c and 600a–c in the various programming arrangements, described above in FIGS. 6–9, pins are provided for configuration programming. Some of the aforementioned pins are dedicated to configuration programming and unusable during normal operation of these PLDs 300, 400, 500a–c and 600a–c. The remaining pins are multiplexed. The multiplexed pins are used both during the configuration process and normal operation of the PLDs 300, 400, 500a–c and 600a–c. The multiplexed pins include $M_0$, $M_1$ and $M_2$; DONE; $D_0$, $D_1$, $D_2$, $D_3$, $D_4$, $D_5$, $D_6$ and $D_7$; WE; RDY; and $D_{OUT}$.

The $M_0$, $M_1$ and $M_2$ pins are employed to receive signals that define one of eight operational modes that are supported by the PLDs 300, 400, 500a–c and 600a–c. Five of the operational modes achieve configuration programming, one of the operational modes is for testing the configuration data loaded into the PLD and the remaining two operational modes are reserved. Each type of operational mode will be determined by the state of the mode pins ($M_0$, $M_1$ and $M_2$). The value of the mode pins $M_0$, $M_1$ and $M_2$ for the programming operational modes are shown below in table 1. Otherwise, mode pins $M_1$, $M_0$, and M2 function as input/output (I/O) pins during normal operation.

TABLE 1

| Operational Mode | $M_2$ | $M_1$ | $M_0$ |
| --- | --- | --- | --- |
| Serial Internal Last | 0 | 0 | 0 |
| Serial External Last | 0 | 0 | 1 |
| Reserved | 0 | 1 | 0 |
| Readback | 0 | 1 | 1 |
| Serial External First | 1 | 0 | 0 |
| Processor Last | 1 | 0 | 1 |
| Processor First | 1 | 1 | 0 |
| Reserved | 1 | 1 | 1 |

The Readback operational mode allows the programmed bit-stream to be readback from the PLDs 300, 400, 500a–c and 600a–c for analysis, discussed more fully below. Serial External Last occurs when an external clock is being used and a PLD is either the only PLD 300, as shown in FIG. 6 or the last PLD 500c in a programming chain to be configured in a multiple serial programming mode, shown in FIG. 8. Serial Internal Last is the mode used in three cases when no external clock is used. This is used when there is only one PLD 300 to be programmed or this is the last PLD 500c to be programmed in a chain of PLDs. Serial External First is only used where there are a multiple number of PLD 500a–b in a programming chain and the PLD is not the last PLD 500c in the chain, shown in FIG. 8. Here the clock will be generated either by an external source or the last chip to be programmed. Processor Last is used in processor programming mode when the PLD 400, shown in FIG. 7, is either the only PLD 400 or the last PLD 600c to be programmed in a multiple processor programming mode, shown in FIG. 9. Processor First is only used in processor mode and the PLD 600a–b is in a programming chain and is not the last PLD 600c.

The DONE pin functions as an input pin during programming that is used when multiple numbers of PLD 500a–c or 600a–c, shown in FIGS. 8 and 9, respectively, are concurrently being programmed. Typically multiple PLDs 500a–c or 600a–c are linked in a daisy chain when being programmed. Were the PLD not located at the end of the daisy chain, such as 500a–b and 600a–b, the DONE pin is tied to the SYSDONE. A transition between a logical "0" and a logical "1" on the DONE pin indicates that programming has been completed and the PLD 500a–c or 600a–c should begin normal operation. This DONE pin may be employed as an I/O during normal operation The $D_0$ pin is an input pin during programming that accepts serial data from a memory source 302 and 502, or another PLD 300, 500a–c. The $D_0$ pin my also receive the least significant bit (LSB) from a byte wide memory source in either the single PLD or multiple PLD processor programming arrangement. The $D_0$ pin may also be used as an I/O during normal operation.

Pins $D_1$–$D_7$ are input pins during processor mode that are activated after a reset signal has been applied. They accepts bits 1–7 of data being loaded from a parallel source during either the single PLD or multiple PLD processor arrangement and can be used as I/Os during normal operation.

The WE pin is another input pin during either the single PLD or multiple PLD processor arrangement that activates after the reset signal has been applied. The WE pin may also used by the processor 402 and 602, shown in FIGS. 7 and 9, respectively, to signal the PLD 400 or PLDs 600a–c that eight bits have been placed on the $D_1$–$D_7$ pins and should be loaded. This pin reverts to an I/Os during normal operation.

The RDY pin functions as output during processor mode to signal an external processor that eight bits have been loaded and the PLD 300, 400, 500a–c and 600a–c of FIGS. 6–9, respectively, is ready to receive an additional eight bits. The RDY pin may be used as an I/O during normal operation. In the multiple PLD processor arrangement, the RDY pin is well controlled by connecting all of the RDY pins of the multiple PLDs 600a, 600b and 600c together. In this fashion a one of the RDY pins may be active at a time.

The $D_{OUT}$ pin is used to output a bit-stream during readback. This pin can be used as an I/O during normal operation.

Referring again to FIGS. 6–9, the dedicated pins include the PCLK pin, the STRPGM pin, the RESET pin, and the SYSDONE pin. The PCLK pin is a three-function pin. Were the PLD to be the only device being programmed, such as PLDs 300 and 400, and an external clock not being used, a master clock pulse would be present on the PCLK pin. In multiple PLD serial arrangement, the signal from the PCLK pin may function as a master clock pulse transmitted to all other PLDs 500a–b and the serial PROM 502 being programmed were multiple PLD 500a–c being programmed and the PLD 500c associated with the PCLK pin the last in the chain of PLDs 500a–c. In this manner, the PCLK pin of PLDs 500a–b functions as an input pin to receives the master clock pulse from PLD 500c. Were an external clock employed when programming the PLD 300, 400, 500a–c and 600a–c the external clock pulse is placed on the PCLK pin. During normal operation, the PCLK defaults to an input.

The bit-stream is placed on the STRPGM pin to initiate loading of the PLD 300, 400, 500a–c and 600a–c. Upon power-up, were the PLD in either the single PLD or multiple PLD serial programming arrangement and is not last PLD in a chain, such as PLDs 300 and 500a–b, the STPGM pin is preferably connected to an appropriate RC network.

The RESET pin is employed to reset the configuration circuitry if it is desired to reconfigure a previously programmed PLD 300, 400, 500a–c and 600a–c. Were the Upon power-up, were the PLD in either the single PLD or multiple PLD serial programming arrangement and is not last PLD in a chain, such as PLDs 300 and 500a–b, the speed of the power-up Vcc ramp determines how the RESET pin should be treated. Were the power-up Vcc ramp faster than 3V/ms, the RESET pin should be tied to Vcc. Were the power-on Vcc ramp slower than 3V/ms, the RESET pin should be connected to the same RC networks as the STRPGM pin.

The SYSDONE pin has a signal thereon that transitions from a logical "0" to a logical "1" and maintains a logical "1" until either the power to the PLD 300, 400, 500a–c and 600a–c is turned off or a reset signal is applied. Were the PLD the last in a chain of PLDs being programmed, such as PLDs 500c and 600c, or the only, PLD being programmed, such as PLDs, 300 and 400, this pin indicates that programming is completed and commencement of normal operation begins. Also, if the PLD is the last in a chain of PLDs being programmed, such as PLDs 500c and 600c, signals on the SYSDONE pin indicates to all other PLDs, such as 500a–b and 600a–b that programming has been completed and to commence normal operation. This signal also controls the enabling and disabling of a serial PROM(s) 302 and 502.

The bit-stream configuration used to programmably configure the PLD 300, 400, 500a–c and 600a–c by individually programming each logic connection (LC), as well as the clocks and the I/O's. This means that given an address, the RAM bits in any LC can be accessed for programming. This overcomes a problem with programming large PLDs. Specifically, it was found that simultaneously programming all the SRAM cells created a large spike on the Vcc line due to the current draw. This problem is overcome by individually programming each LC connection.

Another advantage with the PLD 300, 400, 500a–c and 600a–c is that upon power-up, all the RAM memory cells are reset. This means that only those LC's that are used need to be programmed. Since each LC is addressable and all RAM memory cells are reset. Thus, the software only needs to produce configuration bits for those sections of the device that are being utilized. This makes for varying lengths of bit-streams, but has several benefits. One benefit is that programming times can be greatly reduced. Another is that the testing of the device is greatly enhanced. A divide-and-conquer strategy can be employed when testing. The last advantage comes with a small addition to the bit-stream. In accessing any group that needs to be programmed, the RAM bits in that group are first reset before they are programmed. This allows the capability of "dynamic reconfiguration". Small sections of the device can be reconfigured during the normal operation of the device.

Since the PLDs can be configured in-groups, such as 500a–c and 600a–c, the bit-stream adapted for programmably configuring the PLDs 500a–c and 600a–c facilitates this technique. To that end, bit-stream is broken up into a number of "frames". There are four types of frames. They are the Start Frame, the Stop Frame, the Address Frame and the Data Frame. The start, stop and address frames are all thirty-two bits long. The data frame's length is variable depending, depending upon the application.

The Start Frame signals the PLD 300, 400, 500a–c and 600a–c that programming is to begin and is thirty-two bits long having a predefined pattern. The predefinedpattern is as follows: "1111 0011 1100 1111 0011 1100 1010 1111", with most significant bit (MSB) being on the far left and the LSB being on the far right. The pattern enters the chip from right to left, i.e. the LSB enters first. When the PLD 300, 400, 500a–c and 600a–c detects the predefined pattern of the Start Frame, programming of the PLD 300, 400, 500a–c and 600a–c commences.

The Stop Frame signals the PLD 300, 400, 500a–c and 600a–c that programming is completed by indicating that there are no additional address and data frames. The Stop Frame is thirty-two bits in length long and has a predetermined pattern. The predetermined pattern is as follows: "1111 0000 1111 1111 0000 1100 1010 1111", with the MSB being on the far left and the LSB being on the far right. The pattern enters the chip from right to left, i.e. the LSB enters first. When the PLD 300, 400, 500a–c and 600a–c detects the predetermined pattern, programming ceases and the PLD 300, 400, 500a–c and 600a–c prepares for normal operation.

The Address Frame is a thirty-two-bit sequence that performs two functions. Primarily, the Address Frame contains address of the PLD 300, 400, 500a–c and 600a–c area to be programmed and that a data frame will be coming. This orders the programming circuit to switch from examining the thirty-two bit data streams to examining data streams as eight bit sequences. This also makes it impossible to inadvertently get the stop frame by mistake. The thirty-two bits of the address frame are divided into five groups. These are the group address, the row address, and the column address, the settling bits and the bit-reset sequence. The sequence is as follows: "PPPPP SSSSSSSS RRR YYYY RRR XXXX GGGG 1". As before, the MSB is on the far left and the LSB is on the far right. The pattern enters the chip from right to left, i.e., the LSB enters first. The sequence always starts with a "1". Following that are 4 bits which that define the group address. The next seven bits define the row address. The first 4 bits are the row address that is being used and the next three are reserved for future use. Next is the seven bits of the column address. Again, the first four bits are used for the column address and the next three bits are reserved for future use. Following that are the eight bits for settling. These bits allow the previous addresses time to decode the proper location and prepare for programming. The last five bits perform two functions. The first function is to reset all the memory bits in the group that is being addressed. The remaining function is to notify the system that data bits will be coming and to disable the thirty-two bit functions and enable the eight bit functions.

The Data Frame contains the actual instructions to program the appropriate memory cells in the group that you are addressing. Because of this, the width of this frame is variable, e.g., it takes more bits to program a complete logic connection then it does to program an I/O cell. The basic number of bits in a data frame can be computed by the following equation:

$$\text{Number of bits } (N) = (R+M)*8$$

where R=Number of registers per address and M=Number of Write clocks per write cycle. This number is only basic because the end of the data frame must also contain an instruction code that will tell the system that the data has been loaded and to active the thirty-two bit functions. The address and data frame make up a set that contains the necessary bits to program any specific group (e.g. LC). The number of sets is dependent on how much of the PLD 300, 400, 500a–c and 600a–c needs to be configured.

An additional bit-stream employed to ensure the PLD 300, 400, 500a–c and 600a–c is stabilized before programming commences is referred to as the Preamble. Upon power-up, the PLD 300, 400, 500a–c and 600a–c requires a finite amount of time to stabilize. To prevent commencement of programming until the aforementioned finite amount of time has lapsed, a number of logical "0"'s can be placed in front of the Start Frame to provide an extra bit of delay. The logical "0"'s are ignored by the PLD 300, 400, 500a–c and 600a–c's circuitry.

When the PLD 300, 400, 500a–c and 600a–c enters one of the aforementioned operational modes, there are multiple signals that are created to control the various circuits. These signals respond to power-up voltages, i.e., and the initial applying of Vcc and GND, the application of a reset signal and normal operation. Each signal is used to control various parts of the PLD 300, 400, 500a–c and 600a–c in and out of configuration. Specifically, there are seven of these signals that are employed. Five signals are provided to control the I/Os, depending on the configuration mode. These five signals all have the form of pgm_mode_g. The variable "G" is used to designate a particular state of programming. The five signals are as follows:

| pgm_mode_cfg | |
| --- | --- |
| pgm_mode_std | pgm_mode_ready |
| pgm_mode_cpu | pgm_mode_rdbk |

The pgm_mode_cfg signal indicates signal configuration and is active during programming. The pgm_mode_cfg signal control programming pins $M_0$, $M_1$, $M_2$, DONE and $D_0$ and has a logical "1" present when either power is applied or the reset signal is applied. During normal operation, this signal will be "0".

The pgm_mode_std signal controls user I/O pins that are not used during programming. The pgm_mode_std signal will be used to tri-state these I/O during initial programming so that the I/Os act as inputs. Upon termination of programming, this signal goes low, and the I/O assumes their normal states. This signal can be reset by terminating power to the PLD 300, 400, 500*a–c* and 600*a–c* and then powering-up the same. Signals at the Reset pin have no effect on the pgm_mode_std signal. This facilitates partial reprogramming of the PLD 300, 400, 500*a–c* and 600*a–c*.

The pgm_mode_cpu signal has two operational states. Were the mode pins $M_0$, $M_1$ and $M_2$ set for processor mode, this signal is gated off of pgm_mode_cfg and allows the pins $D_1$, $D_2$, $D_3$, $D_4$, $D_5$, $D_6$, $D_7$ and WE to be used as inputs. If processor mode is not selected, this signal is gated off of pgm_mode_std and acts like a user I/O. Because of this, signals at the Reset pin only effect the pgm_mode_cpu signal if processor mode is selected and control is by pgm_mode_cfg. Were the processor mode not selected, the pgm_mode_cpu signal is controlled by pgm_mode_std and is not affected by the signals at the Reset pin.

The pgm_mode_ready signal also has two operational states. Were the mode pins $M_0$, $M_1$ and $M_2$ set for processor mode, this signal gated off of SYSDONE and allows the RDY output to act like an output. The actual output control is generated by the rdy_control signal, discussed more fully below. The pgm_mode_rdy and rdy_control signals both work in tandem to properly determine the state of the RDY output pin. Were the mode pins $M_0$, $M_1$ and $M_2$ not set for processor mode, this signal is gated off of pgm_mode_std signal and acts like a user I/O.

The pgm_mode_rdbk signal has two operational states. One of the operational states enables the $D_{OUT}$ pin to be used as an output. To that end, were mode pins $M_0$, $M_1$ and $M_2$ set for readback, the pgm_mode_rdbk signal is gated off of pgm_mode_cfg. The actual output control of the $D_{OUT}$ pin, however, is generated by the rdbk_control signal. The pgm_mode_rdbk and rdbk_control work in tandem to properly determine the state of the $D_0$ output pin. Were the mode pins $M_0$, $M_1$ and $M_2$ not set for readback, the pgm_mode_rdbk signal gated off of the pgm_mode_std signal and acts like a user I/O.

The rdy_control signal is generated to control the RDY pin output when the PLD is in one of the processor operational modes and should respond to several sets of signals. Upon power-up, or strobbing, the reset signal, rdy_control is at a logical "0" to disable the RDY pin output. The rdy_control signal goes to a logical "1" upon the st_pgm signal transitioning from a logical "0" to a logical "1", when the PLD is in one of the processor operational modes. Changing rdy_control to a logical "1" allows the RDY pin output to become active. The RDY output will stay active until the SYSDONE pin has a signal present that transitions from a logical "0" to a logical "1". This results in the rdy_control signal returning to a logical "0", thereby disabling RDY pin output. The rdy_control signal can be easily generated using the AND of st_pgm signal, the detection of either of the processor operational modes and the inversion of the signal at the SYSDONE pin. Were the processor operational modes not detected, the I/O buffer pertaining to the RDY pin output would be controlled by the pgm_mode_std signal. This will allow the RDY pin output to act like a standard user I/O during programming. The pgm_mode rdy signal may be employed to perform this function.

The rdbk_control signal is employed to control the state of the $D_{OUT}$ pin when readback mode is selected. The rdbk_control signal responds similarly to the rdy_control signal excepting that the rdbk_control signal is triggered by the mode code for readback rather than processor. When readback mode is selected, rdbk_control signal should be at a logical "1", which activates the $D_{OUT}$ pin to output an internal bit-stream. The rdbk_control signal maintains a logical "1" so long as readback mode is selected. When readback is completed, rdbk_control signal should go to a logical "0" and the $D_{OUT}$ output should revert back to its programmed state. Were the readback mode not selected, rdbk_control signal should be at a logical "0".

To program the PLD 300, 400, 500*a–c* and 600*a–c* with configuration data, one of two situations are typically present. In the first situation, configuration data is programmed upon power-up of the PLD 300. This typically occurs when one or more of the PLDs 300 400, 500*a–c* and 600*a–c* 00s are present on a printed circuit (PC) board within a system and power is applied to the system, the PC board and the PLD 300, 400, 500*a–c* and 600*a–c*. The second situation occurs when reprogramming a previously programmed PLD 300, 400, 500*a–c* and 600*a–c* by loading new configuration data. Generally, power will already have been applied to the PLD 300, 400, 500*a–c* and 600*a–c*, and the configuration data will be reloaded through some type of external interface.

Programming the PLD 300, 400, 500*a–c* and 600*a–c* upon initial power-up typically requires the following steps:

Decoding mode pins $M_0$, $M_1$ and $M_2$

Configuring I/O's that are shared pins for programming as inputs or outputs

Configuring all remaining I/O's as inputs

Starting an internal clock

Resetting the configuration logic

Resetting all configuration memory cells to the logical "0" state

The foregoing steps are exemplary steps that should be undertaken when configuring the PLD 300, 400, 500*a–c* and 600*a–c* upon power-up. However, the exact order of the steps in application dependent. The order in which the steps are performed should be chosen to avoid latch-up conditions while preparing the PLD 300, 400, 500*a–c* and 600*a–c* receive configuration data.

When the configuration data is being loaded, all I/O's should be tri-stated, because the outputs will not be truly defined until after the configuration data has been loaded. In addition to the fact that some of the actual output pins may be used as input pins during configuration, this measure is necessary to ensure that there will not be a pin conflict. For one of the processor operational modes, nine additional other pins are typically required, discussed more fully below.

To synchronize the operations of the components during configuration programming, either an internal or external clock signal may be employed on the PLD 300. To that end, a dedicated pin (PCK) on the PLD 300, 400, 500*a–c* and 600*a–c* is provided. The PCK pin can either be used as an input for an external clock or as an output of the internally generated clock. As discussed above, this depends upon the type of programming arrangement and operational configuration desired, the internal circuitry would make this choice.

There are two situations where an external clock is desired. The first is where the PLD is one of multiple PLDs being programmed and is not the last PLD 300 in the chain of PLDs to be configured, such as PLDs 500*a–b* and 600*a–b* shown in FIGS. 8 and 9. Here a master clock generated by the last PLD 500*c* and 600*c* in the chain may be connected to be received by the remaining PLD 500a–b and 600a–b. Care must be taken in this arrangement to ensure that the master clock output is capable of driving a number of other PLD 500a–b and 600a–b and the accompanying board capacitance.

The other situation in which an externally generated clock is employed when it is desired to shorten the configuration program time. This can be done by applying an external clock and using a memory source, such as 302 shown in FIG. 6, with access times much faster than the period of clock.

Were an internal clock employed it should be activated upon power-up and will be stopped once the configuration has been completed. The internal clock should run at a speed of no greater than 6 MHz. This ensures that a very wide selection of memory elements can be used to store the configuration data.

Finally, it is desired to reset the PLD 300, 400, 500a–c and 600a–c to ensure all counters and registers start from a known state. Otherwise, it may be possible that early false signals will be generated which could corrupt the configuration process. Specifically, were the PLD 300, 400, 500a–c and 600a–c previously programmed, and power has not been maintained, an active logical "0" reset signal must be activated in order to change the configuration, i.e., reprogram the PLD 300, 400, 500a–c and 600a–c. The reset signal is somewhat similar to power-up, but not as powerful. The reset signal resets the configuration logic to prepare for configuration. After the reset signal has been asserted, configuration can commence. The reset signal does not reset any of the RAM bits or change the state of those I/O that are not being used for programming. Resetting all RAM bits to a "0" and making the default state "0" facilitates selective programming of sub-portions of the PLD 300, 400, 500a–c and 600a–c. Unused LCs need not be programmed if already in the default state. This may greatly reduce the time required to reprogram the configuration of the PLD 300, 400, 500a–c and 600a–c. However, the treatment of the RESET pin during programming can be dependent on the ramp rate of Vcc, which is specified in the definition of the RESET pin.

Before programming the PLD 300, 400, 500a–c and 600a–c with configuration data, after power-up, a preconfiguration routine is implement to ensure that is a short set of items to be accomplished after the chip has been powered up and before the actual configuration data is loaded. The pre-configuration routine includes the following steps:

waiting a predetermined amount of time, e.g., ten seconds, after power-up (processor operational mode only);
applying the reset signal (reprogramming or processor operational mode only);
detecting a signal from the "STPGM" pin;
decoding the mode pins $M_0$, $M_1$ and $M_2$;
waiting seven clock cycles for circuitry to settle (if programming a single PLD 300 and 500 or the first PLD 500a and 600a in a chain of multiple PLDs being programmed);
outputting an external clock source if the PLD 300 is serial internal last operational mode;
forcing the SYSDONE pin to a logical "0";
enabling the 32-bit register circuitry; and
waiting for the Start Frame.

The waiting step is employed if the PLD 400 and 600a–c is in processor operational mode to allow circuitry to completely stabilize. Since the configuration bits in this mode are be loaded in increments of eight, it is not suitable to use a large number of dummy bits in front of the start code as a buffer.

The "STRPGM" pin is used to initiate programming and is distinguishable from the RESET pin that is employed to reset the configuration circuits. The STRPGM pin is used to gate the clock, either internal or external, that controls the timing of the configuration program. If a logical "0" is present at the STRP GM, the PLD 300, 400, 500a–c and 600a–c may not be configured. When a logical "1" is present at the STRPGM pin, the configuration program is initiated. Specifically, were the PLD the only PLD being programmed, such as PLDs 300 and 400, or the last PLD in a chain of multiple PLDs being programmed, such as PLDs 500c and 600c, the STRPGM pin is connected to an RC network. Were the PLD used in a system where it is one of a multiple number of PLDs being programmed, but is not the last PLD in the chain, such as PLDs 500a–b and 600a–b, the STRPGM pin is connected to the "SYSDONE" pin signal from the previous PLD. Were the PLD 300 being programmed in the processor operational mode, the STRPGM pin is manipulated by an external signal source, such as processor 402 and 602.

As stated earlier, the signals on the mode pins $M_0$, $M_1$ and $M_2$ define the configuration of the PLD 300, 400, 500a–c and 600a–c. Once detected, the signals on the mode pins $M_0$, $M_1$ and $M_2$ control the state of the internal clock plus other configuration circuitry In order to give the circuitry some time to settle, a delay of seven clock cycles is provided. However, the amount of the delay may be easily supplemented by introducing a number of logical "0's" to the front of the bit-stream before the Start Frame. This ensures that the PLD 300, 400, 500a–c and 600a–c has sufficient time to stabilize after power-up. After the delay, the circuitry should output the external clock if it is necessary. This clock will be used to drive a serial ROM and possibly be used as the external clock for other PLDs 500a–c and 600a–c if a programming chain is created. Note, however, that the output clock has same phase as the internally generated clock.

The SYSDONE pin is be driven to a "0" until programming has been completed. Once programming has been completed, the SYSDONE pin is maintained at a logical "1". The SYSDONE pin is used for several purposes. One is to enable and disable the serial memory(s) that are employed to program configuration bits into the PLD 300. Additionally the SYSDONE pin may be connected to the DONE pin of all the remaining PLDs connected in a daisy chain, were the PLD associated with the SYSDONE pin the last in PLD in the chain. In this manner, the SYSDONE pin may supply a signal to the remaining PLDs in the chain that programming is completed.

The thirty-two-bit register circuitry is used to detect the Start Frame, the Stop Frame and the Address Frame and is enabled to sample the incoming bit-stream, therefor. An increased settling time may be employed to compensate for the dummy bits that are added to the bit-stream before the Start Frame.

As mentioned above, there is a number of programming arrangements that may be employed to load data. In the serial programming arrangement, data is programmed into the PLD 300 in the following sequence:

Detect the Start Frame;
Decode the Address Frame;
Apply proper addresses to select group;
Reset all memory cells in group to "0";

Disable thirty-two-bit registers circuit and enable an eight-bit register circuit;

Pass configuration bits to circuit;

Program the configuration;

Detect trailer bits signaling end of configuration data frame;

Disable the eight-bit register circuit and enable the thirty-two-bit register circuit;

Go to the Decode the Address Frame step, if appropriate, and repeat sequence;

Detect the Stop Frame; and

Start the completion process

Preceding the Start Frame is a sequence of dummy bits, e.g., logical "0"s, that arrive in groups of eight that allow the PLD 300, 400, 500a–c and 600a–c to settle after power-up, as discussed above. The detection of the Start Frame signals the programming bits are coming. Once the Address Frame is decoded, a particular group will be selected. All memory cells will be reset because only "1's" will be loaded into the SRAM cells. Once the group has been programmed, control is transferred to the thirty-two bit circuits to detect the next Address Frame. After all the groups have been programmed, the Stop Frame appears and the completion process starts. Were the PLD in a chain of PLDs to be programmed and not the last PLD in the chain, such as PLDs 500a–b and 600a–b, some minor functions will be performed, but the PLD 500a–b and 600a–b will not enter normal operation. The PLD 500a–b and 600a–b will wait until the SYSDONE signal is received from the "last part". Once this happens, or if the PLD is the only part to be programmed, such as PLDs 300 and 400, the full completion process will occur where the PLD transitions from the programming mode to normal operation mode.

Loading data in either the single PLD or multiple PLD processor programming arrangement requires a handshaking between the processor 402 and 602 and the PLD 400 and 600a–c. As discussed above, processor programming arrangement has a pre-configuration sequence that differs from the than serial pre-configuration sequence. For example, due to the ten second delay, the preamble of the bit-stream can be eliminated. Once pre-configuration has been completed, the loading of the configuration data can commence. Since the data entering the PLD 400 and 600a–c will not be in synch with the clock of the processor 402 and 602, a synchronizing circuit is employed to prevent a metastable event from occurring. The WE and RDY pins will be used to control these functions. Specifically the WE pin is used as an input by the external source to signal the PLD 400 and 600a–c that eight bits of configuration data has been applied. The RDY pin is an output of the PLD 400 and 600a–c to signal, e.g., a logical "1", the external processor that the eight bits have been loaded and is ready to accept another eight bits of configuration data. Upon detection of the signal from the RDY pin, the processor applies eight bits of configuration data to one or more of the data input pins $D_1$, $D_2$, $D_3$, $D_4$, $D_5$, $D_6$ and $D_7$ and then forces the "WE" signal to a logical "1". The eight bits are maintained on the data input pins $D_1$, $D_2$, $D_3$, $D_4$, $D_5$, $D_6$ and $D_7$ until the processor detects the next RDY signal. Upon the "WE" pin receiving a signal transitioning from a logical "0" to a logical "1", the PLD 400 and 600a–c loads the eight bits of configuration data and shifts the bits into either the thirty-two bit register circuit or the eight bit register section. At this time, the RDY line will go to a logical "0" until the PLD 400 and 600a–c is ready for the next eight bits of configuration data.

The MSB and LSB of the configuration data should be placed on the PLD 300, 400, 500a–c and 600a–c so that the LSB is applied to the $D_0$ input and MSB is applied to the $D_7$ input. This is true of every eight-bit segment in the bit-stream. However, it is also entirely possible that the length of the bit-stream is not divisible by eight. If that is the case, in the last eight bits that are applied, missing bits should be filled in with logical "0"s starting with the bits directed at $D_7$. This can be illustrated assuming an eight-bit segment represented as 'ABCDEFGH'. Were the last eight-bit segment missing three bits, F, G and H would have a logical "0" present to complete the eight-bit sequence. The LSB, in this example "A" would be applied to the $D_0$ input, and the three logical "0"s would be applied to the $D_5$, $D_6$ and $D_7$ inputs.

Once the configuration data has been loaded into a PLD using one of the aforementioned modes, the following routine is executed were the PLD one of a sequence of PLD to be configured, such as PLDs 500a–b and 600a–b:

The Stop Frame is detected;

The signal on the SYSDONE pin is output to adjacent PLD, allowing the same to receive the bit-stream; and The PLD wait for a signal at the SYSDONE pin.

Were the PLD is either the only or the PLD to be configured, such as PLD 300 and 400, or the last PLD in a group of PLDs being programmed, such as PLD 500c and 600c, a routine is executed following the presence of a signal at the SYSDONE pin to prepare the PLD for normal operation. The routine is as follows:

Send a signal to the SYSDONE pin to all PLDs being programmed in order to disable the serial memory;

If the PLD is not the last PLD in a sequence of PLDs being programmed, detect the DONE signal and start completion sequence Disable the configuration circuit;

Enable the normal circuits;

Activate all inputs and outputs; and

Start normal operations.

Once the PLD 300, 400, 500a–c and 600a–c has been programmed, it may be useful to readback the bit-stream to find out if it was loaded properly. A mode has been created called readback for this purpose. The readback mode is performed in a sequence that is identical to serial programming. The only difference between the two modes is that in the readback mode programmed bits are readout and loaded into the serial shift register. This means that in order to perform readback, a Start Frame, a Stop Frame, an Address Frame and Data Frames are required. If the desired address to be read is not contained in the Address Frame, the bit associated with the desired address will not be detected. The ideal mode would be to use the same bit-stream employed to program the PLD 300, 400, 500a–c and 600a–c. The processor configuration mode was employed, software may be created to generate a serial bit-stream may be used for the purposes of readback. The bit-stream will present at the $D_{OUT}$ pin. In this fashion, the $D_{OUT}$ pin will be activated for this purpose during readback. Otherwise the $D_{OUT}$ pin will function as a normal user I/O.

Figure 10:
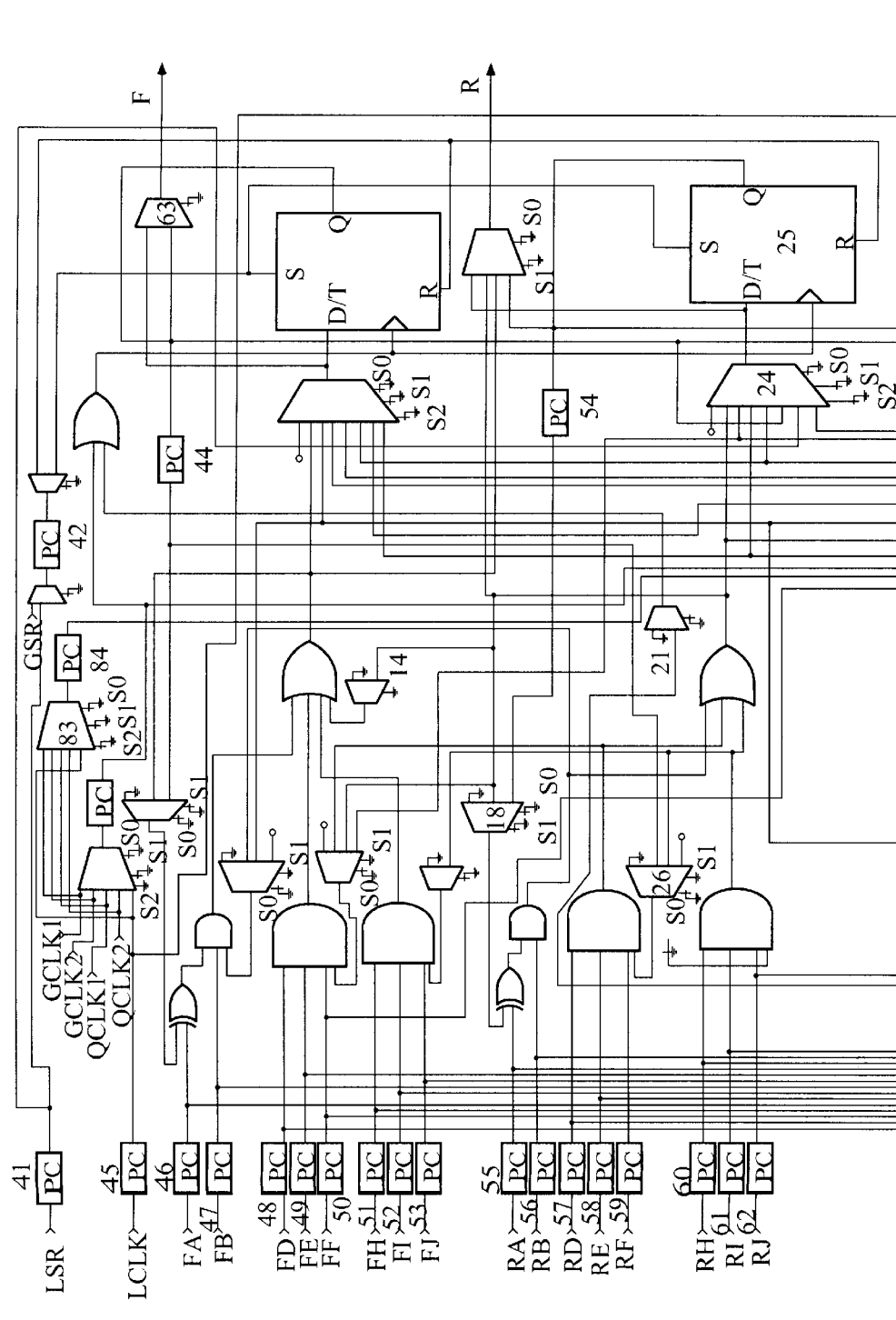
FIG. 10 is a schematic drawing of the circuitry of one logic cell shown above in FIG. 3, in accordance with an alternate embodiment.

Although the foregoing has been a description of the preferred embodiment of the PLD, it should be appreciated that numerous variations in the specific details and structures described can be implemented. For example, as shown in FIG. 10, a preferred embodiment of the logic cell, shown above in FIG. 3, may be provided with only slight modifications. In addition, although it is preferred to implement the aforementioned invention using CMOS technology, BiCMOS may be employed, as well. Accordingly, the scope of the invention is set forth by the appended claims.

What is claimed is:

1. A logic cell having an input node and an outout node, the logic cell comprising:
   an AND/OR circuit connected between said inout and output nodes to provide AND-OR logic functions; and
   a random access memory having input points and output points, with a subset of input points being in data communication with said input node,
   wherein said random access memory includes circuitry adapted to selectively choose between a plurality of memory configurations selected from the set consisting of a single-port random access memory and a dual-port memory.

2. A logic cell having an input node and an output node, the logic cell comprising:
   an AND/OR circuit connected between said input and output nodes to provide AND-OR logic functions; and
   a random access memory having input points and output points, with a subset of input points being in data communication with said input node,
   wherein said random access memory includes circuitry adapted to selectively choose between a plurality of memory configurations selected from the set consisting of a 32×1 single-port random access memory, two 16×1 single-port random access memories, and a 32×1 dual-port memory.

3. A logic cell having an input node and an output node, the logic cell comprising:
   an AND/OR circuit connected between said input and output nodes to provide AND-OR logic functions; and
   a random access memory having inout points and output points, with a subset of input points being in data communication with said input node,
   wherein said random access memory has two output ports and includes an output selection circuit to selectively preclude data from being placed on one of said two output ports.

4. A logic cell having an input node and an output node, the logic cell comprising:
   an AND/OR circuit connected between said input and output nodes to provide AND-OR logic functions; and
   a random access memory having input points and output points, with a subset of input points being in data communication with said input node,
   wherein said random access memory includes two arrays of memory storage elements and a switching circuit connected to both of said two arrays of memory storage elements and said input node, and
   wherein said switching circuit selectively chooses which of said two arrays are addressed in response to signals at said input node.

5. The logic cell as recited in claim 4, wherein any given element in one of said two arrays of memory storage elements has an address identical to an address of a memory storage element contained in the remaining array of memory storage elements.

6. A logic cell having an input node and an output node, the loaic cell comprising:
   an AND/OR circuit connected between said input and output nodes to provide AND-OR logic functions;
   a random access memory having input points and output points, with a subset of input points being in data communication with said input node; and
   two output circuits,
   wherein said AND/OR circuit includes first and second logic circuits, each of which is connected to one of the two output circuits, and said random access memory includes a plurality of output ports, each of which is connected to one of the two output circuits, with the output port connected to one of the two output circuits differing from the output port connected to the remaining output circuit.

7. A logic cell for a programmable logic device, the logic cell comprising:
   an AND-OR circuit to provide AND-OR logic functions, said circuit having input and output nodes;
   a random access memory having input points and output points, with a subset of input points being in data communication with said input node; and
   two output circuits,
   wherein said AND-OR circuit includes first and second logic circuits, each of which is adapted to provide AND-OR logic functions and is connected to one of the two output circuits, and said random access memory includes a plurality of output ports, each of which is connected to one of the two output circuits, with the output port connected to one of the two output circuits differing from the output port connected to the remaining output circuit.

8. The logic cell as recited in claim 7, further including an adder circuit connected to said input node.

9. The logic cell as recited in claim 8, wherein said random access memory includes configuration circuitry adapted to selectively choose between a plurality of memory configurations selected from the set consisting of a single input port random access memory and a dual input port memory.

10. The logic cell as recited in claim 9, wherein said dual input port memory is a 32×1 memory and said single input port random access memory is selected from the set consisting of a 32×1 single input port random access memory and two 16×1 single input port random access memories.

11. The logic cell as recited in claim 10, further including a clock selection circuit to establish a clock signal for said logic cell, wherein said random access memory includes a clock input point connected to receive said clock signal.

12. A method for operating a logic cell of the type having a plurality of signal inputs and output circuitry, the method comprising:
   connecting input points of a random access memory to a subset of said signal inputs and said output circuitry;
   connecting inputs nodes of an AND-OR logic circuit, which provides AND-OR logic functions, to one of said plurality of signal inputs and said output circuitry;
   concurrently providing an input signal to both said random access memory and said AND-OR logic circuit to produce a desired output signal that is provided to said output circuitry; and
   selectively reconfiguring said random access memory to provide functions selected from the set consisting of a single input port random access memory, a dual input port random access memory, and circuitry to provide AND-OR functions.

13. The method as recited in claim 12, wherein said dual input port random access memory is a 32×1 memory and said single input port random access memory is selected from the set consisting of a 32×1 single input port random access memory and two 16×1 single input port random access memories.

14. A method for operating a logic cell of the type having a plurality of signal input points and output circuitry, the method comprising:

connecting input points of a random access memory to a subset of said signal input points and output points of said random access memory to said output circuitry, said random access memory including two arrays of memory storage elements;

selectively switching between said two arrays, thereby choosing an array of memory elements that will sense signals at said signal input points;

connecting input nodes of an AND-OR logic circuit, which provides AND-OR logic functions, to one of said plurality of signal input points and further to said output circuitry; and concurrently providing an input signal to both said random access memory and said AND-OR logic circuit to produce a desired output signal that is provided to said output circuitry.

* * * * *